US006297067B1

(12) United States Patent
Hattori

(10) Patent No.: US 6,297,067 B1
(45) Date of Patent: Oct. 2, 2001

(54) MANUFACTURE OF FIELD EMISSION ELEMENTS

(75) Inventor: Atsuo Hattori, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/412,925

(22) Filed: Oct. 5, 1999

(30) Foreign Application Priority Data

Oct. 7, 1998 (JP) ........................................... 10-285661

(51) Int. Cl.[7] ........................................... H01L 21/00
(52) U.S. Cl. ........................................... 438/20
(58) Field of Search ........................... 438/20; 445/46, 445/51

(56) References Cited

U.S. PATENT DOCUMENTS 5,599,749 * 2/1997 Hattori .

* cited by examiner

*Primary Examiner*—Charles Bowers
*Assistant Examiner*—Evan Pert
(74) *Attorney, Agent, or Firm*—Ostrolenk, Faber, Gerb & Soffen, LLP

(57) ABSTRACT

A gate film made of conductive material is formed on a substrate, and a resist pattern having an opening with a predetermined shape is formed on the gate film. The resist pattern is reflowed to make the opening have a tapered shape. By using the resist pattern having the taper shaped opening, the gate film and substrate are anisotropically etched to form a taper shaped opening through the gate film and in the substrate to some depth. After the left resist pattern is etched and removed, the first sacrificial film is formed covering the gate film and substrate with the opening to thereby form an emitter film of conductive material on the first sacrificial film. Unnecessary portions are etched and removed to expose the emitter and gate film and complete a field emission element.

25 Claims, 28 Drawing Sheets

MANUFACTURE OF FIELD EMISSION ELEMENTS

This application is based on Japanese patent application No. 10-285661 filed on Oct. 7, 1998, the entire contents of which are incorporated herein by reference as non-essential subject matter.

BACKGROUND OF THE INVENTION a) Field of the Invention

The present invention relates to a field emission element, and more particularly to manufacturing technologies for a field emission element having a field emission cathode from the tip of which electrons are emitted.

b) Description of the Related Art

A field emission element emits electrons from a sharp tip of an emitter (electron emission cathode) by utilizing electric field concentration. For example, a flat panel display can be structured by using a field emitter array (FEA) having a number of emitters disposed on the array. Each emitter controls the luminance of a corresponding pixel of the display.

In order to apply an electric field to the emitter tip of a field emission element and emit electrons therefrom, the gate electrode biased to a positive potential relative to the emitter (cathode) is disposed near the emitter electrode.

An increase in an emission current from the emitter (i.e., a lowered threshold voltage between the gate and emitter), a high speed drive, and the like are requisites for a field emission element. In order to provide these requisites, it is necessary to devise the structure and shape of a field emission element. It is also necessary to devise a manufacture method in order to manufacture such a field emission element stably and reliably.

A low threshold voltage between the gate and emitter can be achieved by making the distance between the emitter and gate electrode surfaces as gate hole of a gate electrode 100 has a rectangular cross section. There is a danger of a short circuit between the gate and emitter electrodes if a distance between the surface of the emitter electrode 110 and the upper edge of the gate electrode 100 is made short. From this reason, the gate electrode 100 cannot be disposed too near the emitter electrode 110.

If a thickness t of the gate electrode 100 is made large, an electric field at the tip of the emitter electrode 110 becomes high so that the threshold voltage between the gate and emitter can be lowered without reducing an emission current. In other words, a larger emission current can be obtained without raising a voltage between the gate and emitter. Further, if the thickness t of the gate electrode 100 is made large, the wiring resistance of the gate electrode 100 becomes low so that a high speed drive becomes possible. However, if the thickness t of the gate electrode 100 having a rectangular cross section of the gate hole such as shown in FIG. 16 is made large, the danger of the short circuit at the upper edge of the gate electrode 100 increases. In order to avoid this, it is necessary to set a longer distance between the tip surface of the emitter electrode 110 and the surface of the gate electrode 100 by reducing the thickness t. It is therefore difficult to lower the threshold voltage.

Another requisite for a field emission element is a sharp tip of the emitter electrode 110. Namely, if an apex angle of the tip of the emitter electrode 110 is made small, the electric field at the tip of the emitter electrode 110 becomes high. It is therefore possible to lower a threshold voltage between the gate and emitter without reducing an emission current, and hence obtain a large emission current without raising a voltage between the gate and emitter. From this reason, it is an important issue to adopt a manufacture method capable of easily sharpening the tip of an emitter electrode 110 having a desired shape.

SUMMARY OF THE INVENTION

It is an object of the present invention to provide a manufacture method for a field emission element having a structure capable of increasing an emission current from the emitter (i.e., lowering a threshold voltage between the gate and emitter) and executing a high speed drive.

It is another object of the invention to provide a manufacturing method for a field emission element having a structure capable of disposing the emitter and gate electrodes as near as possible.

It is another object of the invention to provide a manufacture method for a field emission element capably of sharpening the tip of the emitter electrodes to a large extent.

According to one aspect of the present invention, there is provided a method of manufacturing a field emission element, comprising the steps of: (a) forming a surface layer including a gate film made of a conductive material on a substrate; (b) forming a resist pattern on the surface layer by photolithography, the resist pattern having an opening with a predetermined shape; (c) reflowing the resist pattern to make the opening have an inner diameter gradually reducing toward the substrate; (d) anisotropically etching the gate film by using the reflowed resist pattern as a mask to form an opening through the gate film, the opening having an inner diameter reducing gradually toward the substrate; (e) forming a first sacrificial film covering the gate film having the opening; (f) forming an emitter film made of a conductive material on the first sacrificial film; and (g) removing a portion or a whole of the substrate and a portion of the first sacrificial film to expose the emitter film and the gate film.

According to another aspect of the present invention, there is provided a method of manufacturing a field emission element, comprising the steps of: (a) forming a surface layer including a gate film made of a conductive material on a substrate; (b) forming a low melting point film on the surface layer by photolithography, the low melting point film having a melting point lower than a melting point of the surface layer and an opening with a predetermined shape; (c) reflowing the low melting point film to make the opening have an inner diameter gradually reducing toward the substrate; (d) anisotropically etching the gate film by using the reflowed low melting point film as a mask to form an opening through the gate film, the opening having an inner diameter reducing gradually toward the substrate; (e) forming a first sacrificial film covering the gate film having the opening and/or the low melting point film; (f) forming an emitter film made of a conductive material on the first sacrificial film; and (g) removing a portion or a whole of the substrate and a portion of the first sacrificial film to expose the emitter film and the gate film.

The opening is formed through the gate film, the opening having an inner diameter gradually reducing toward the substrate. This opening allows the surfaces of the gate and emitter electrodes to become near each other in a broad area.

Since such a gently tapered opening is formed by reflowing the resist pattern or low melting point film, the very gentle curve of the opening can be formed with good reproductivity.

By shortening the distance between the surfaces of the emitter and gate electrodes as much as possible without any danger of a short circuit, a low threshold voltage can be obtained. Furthermore, if the thickness of the gate electrode is made large, an electric field at the tip of the emitter electrode can be made strong so that the threshold voltage between the gate and emitter electrodes can be lowered without reducing the emission current. In other words, a large emission current can be obtained without raising the voltage between the gate and emitter electrodes. If the gate electrode is made thick, the gate wiring resistance lowers so that a high speed drive becomes possible.

If the etching conditions are selected, the shape of the tip of the emitter electrode can be controlled and the tip can be made sharp. Namely, by making small the apex angle of the tip of the emitter electrode, the electric field at the tip can be made strong so that the threshold voltage between the gate and emitter electrodes can be lowered without reducing the emission current, and that a large emission current can be obtained without raising the voltage between the gate and emitter electrodes.

Since the tip of the emitter electrode can be made sharp and the skirt thereof can be made gentle, the process of filling emitter material becomes easy.

DETAILED DESCRIPTION OF THE PREFERRED EMBODIMENTS

FIGS. 1A to 1L are cross sectional views of a substrate illustrating the manufacture processes for a field emission element according to the first embodiment of the invention. In the following, the manufacture processes for a two-electrode element having an emitter (field emission cathode) and a gate will be described. The two-electrode element has two electrodes, an emitter electrode for emitting electrons and a gate electrode for controlling an electric field.

Figure 1A:
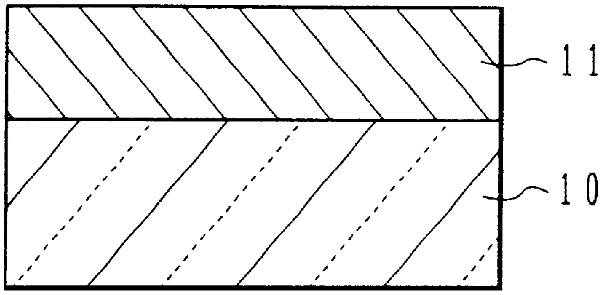
FIGS. 1A to 1L are cross sectional views of a substrate illustrating the manufacture processes for a two-electrode field emission element according to a first embodiment of the invention.

Referring to FIG. 1A, a gate electrode film 11 made of first conductive material is formed on a single layer substrate 10 made of, for example, glass, quartz or the like or on a substrate 10 made of a lamination of an Si layer and a silicon oxide film formed thereon. The first material of the gate electrode film 11 is silicon doped with P (phosphorous) or B (boron) and deposited to a thickness of about 1 μm.

For example, the gate electrode film 11 made of silicon is formed under the conditions of a source gas of $SiH_4$ diluted with He and a substrate temperature of 625° C. In order to lower the resistance value of the gate electrode film 11, P or B ions are diffused or implanted into the gate electrode film 11.

Figure 1B:
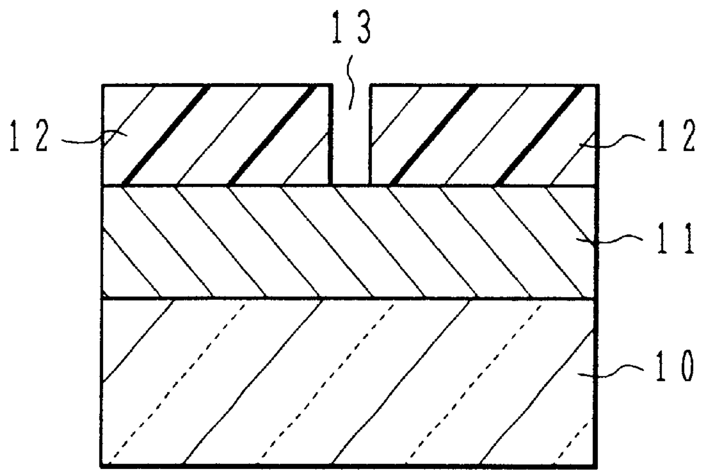

As shown in FIG. 1B, resist material is coated on the gate electrode film 11 and etched through photolithography to form a resist pattern 12 having an opening 13 of about 0.45 μm in diameter. The opening 13 is cylindrical having a rectangular cross section and a circle plan view having the diameter of about 0.45 μm. This resist pattern is formed by the following processes.

For example, photoresist material of the resist pattern 12 is i-line (365 nm) resist THMR-iP3100 manufactured by Tokyo Ohka Kogyo Co. Ltd. and coated to a thickness of about 0.1 μm. In order to improve the size precision of the pattern, it is preferable to coat AZ-AQUATAR manufactured by Clariant (Japan) K.K. to a thickness of about 0.064 μm on the resist material as an upper coated antireflection film.

The resist is exposed to light by using an i-line stepper NSR2005i11D manufactured by Nikon Corp. and a reticle having a predetermined pattern under the conditions of NA=0.57 and sigma=0.4. Thereafter, the resist is developed for 60 seconds by using NMD-3 (TMAH: tetra methyl ammonium hydroxide) manufactured by Tokyo Ohka Kogyo Co., Ltd., and thereafter rinsed with pure water.

Figure 1C:
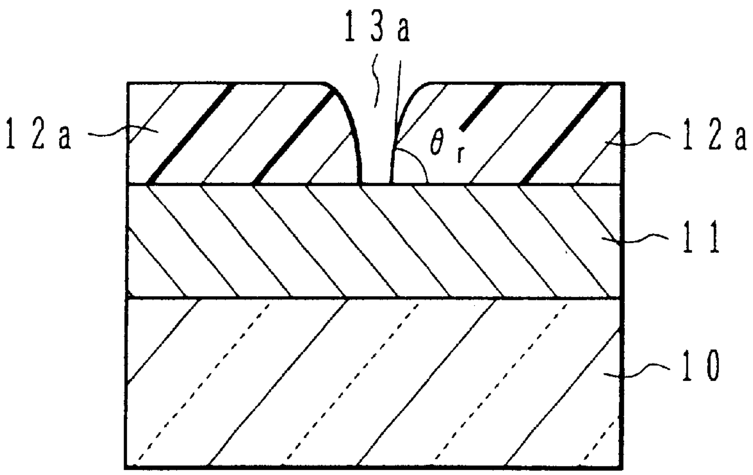

Next, the resist pattern 12 is baked (reflowed), for example, by a hot plate (not shown) at a temperature of 150° C. for about 90 seconds to form a resist pattern 12*a* having a gentle slope upper corner as shown in FIG. 1C. A recess 13*a* has a taper shape in cross section having an inter diameter large at the higher level and gradually making small toward a lower level. The resist pattern 12 may be exposed to ultraviolet rays before it is reflowed. When it is exposed to ultraviolet rays, the temperature for reflowing the resist pattern 12 can be lowered by about 10° C. to 20° C.

Next, by using the reflowed resist pattern 12*a* as a mask, the gate electrode film 11 made of the first conductive material is etched to form a recess (gate hole) 13*b* having a gentle tapered side wall. The recess 13*b* has a gently curved cross section gradually making its inner diameter small toward the substrate 10 (lower portion).

This etching is an over-etch to etch the substrate 10 by about 0.1 μm in depth from the surface of the substrate 10 to form a substrate 10a having a recess. This depth influences the length of an emitter electrode to be later formed. The diameter of the recess 13b of the gate electrode film 11a is about 0.5 μm at the bottom and about 1.5 μm at the upper level, and the depth is about 1 μm.

For example, this etching is performed by using a reactive ion etching (RIE) system under the conditions of an etching gas of $CO_2$+$CHF_3$+Ar and a reaction chamber pressure of 125 mTorr. Etching rate of the gate electrode film 11 is about 1.2 μm/min and etching rate of the resist pattern 12a is about 0.8 μm/min.

Figure 1D:
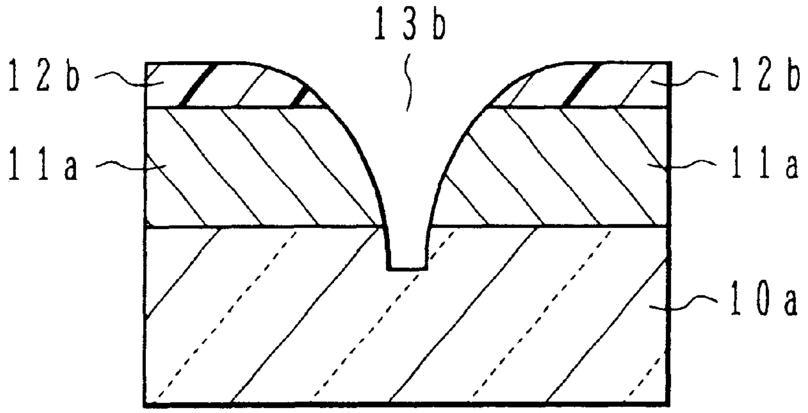
Figure 1E:
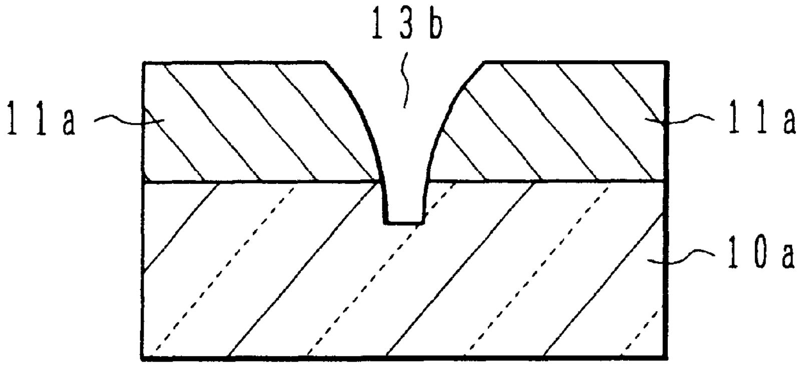

Next, as shown in FIG. 1E, the left resist 12b is removed. For example, in order to remove the resist 12b, $H_2SO_4$+$H_2O_2$ heated to 140° C. is used. Ashing by oxygen plasma or remover such as N-methyl-2-pyrrolidone may also be used.

Figure 1F:
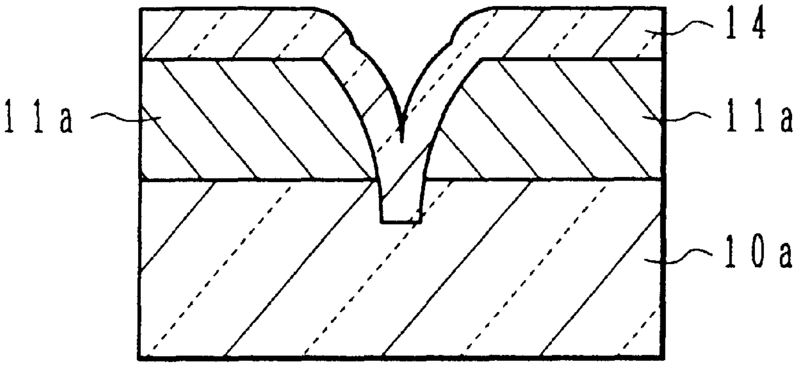

Next as shown in FIG. 1F, a first sacrificial film (insulating film) 14 of silicon oxide is isotropically deposited on the whole substrate surface to a thickness of 0.3 μm by atmospheric pressure chemical vapor deposition (CVD). For example, the first sacrificial film 14 is formed under the conditions of a source gas of $O_3$ and TEOS and a substrate temperature of 400° C. Under these conditions, the first sacrificial film 14 is deposited inheriting (conformal to) the side wall surface shape of the recess 13b.

Figure 1G:
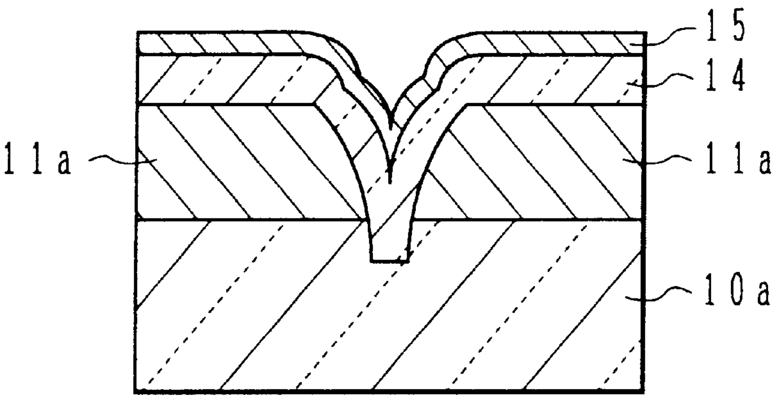

Next as shown in FIG. 1G, a first emitter electrode film 15 of second conductive material such as $TiN_x$ is isotropically deposited on the first.sacrificial film 14 to a thickness of 0.05 μm by reactive sputtering. This reactive sputtering is performed by using a DC sputtering system and Ti as a target while a gas of $N_2$ and Ar is introduced. The first emitter electrode film 15 is therefore formed inheriting (conformal to) the surface shape of the first sacrificial film 14.

The emitter electrode 15 has a two-stage shape. The first stage depends upon the tapered side wall of the gate electrode 11a and the second stage depends upon the upper corner of the gate electrode 11.

Figure 1H:
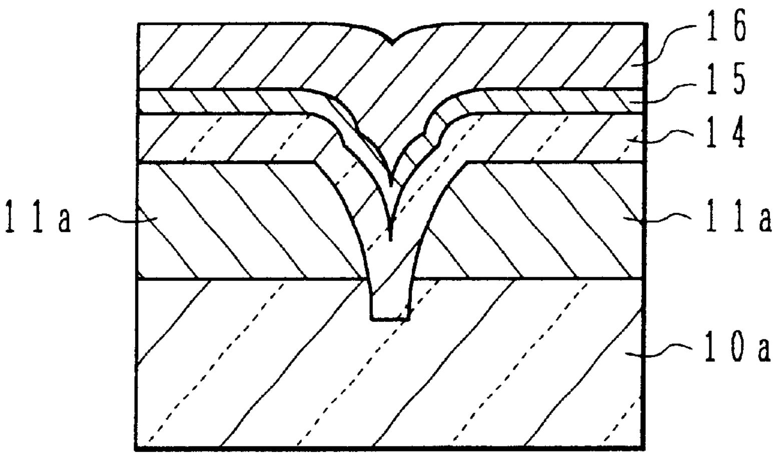

Next, as shown in FIG. 1H, a second emitter electrode film 16 made of third conductive material is deposited on the first emitter electrode film 15 to a thickness of 0.2 μm, the second electrode film 16 serving as a blanket film. For example, the third conductive material is W and is deposited by CVD under the condition of a gas of $WF_6$+$H_2$+$N_2$+Ar, a pressure of 80 Torr and a temperature of 450° C.

Figure 1I:
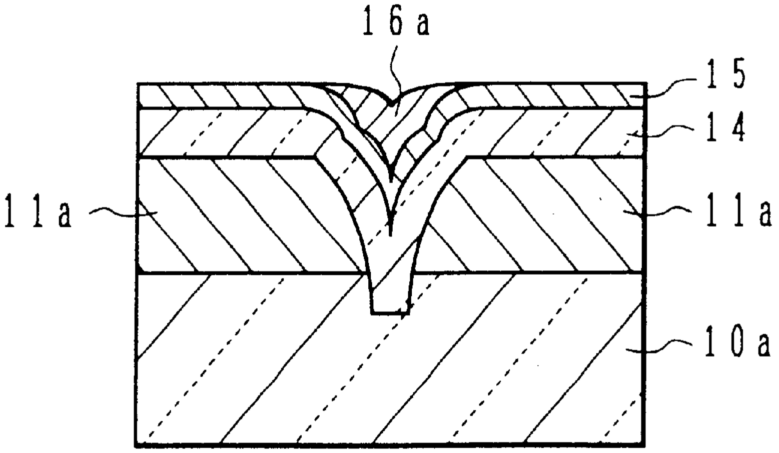

Next, as shown in FIG. 1I, the second emitter electrode film 16 is etched back by 0.2 μm in thickness to leave only a blanket film 16a. The blanket film 16a fills a recess of the first emitter electrode film 15. The etch-back is performed by using an RIE system under the conditions of an etching gas of $SF_6$+Ar+He and a reaction chamber pressure of 280 mTorr.

Figure 1J:
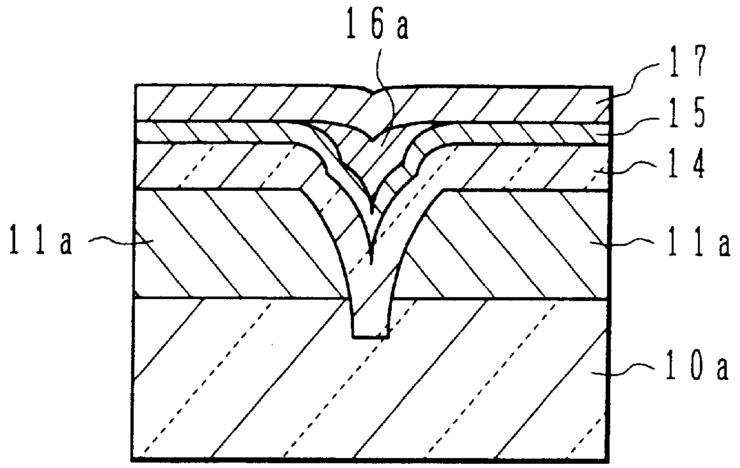

It is known that in order to sufficiently stabilize an emission current from a field emission cathode (emitter), a resistor layer is connected serially to the emitter. As shown in FIG. 1J, therefore, a resistor layer 17 of silicon is deposited to a thickness of about 0.2 μm on the first emitter electrode 15 and blanket film 16a by sputtering.

The silicon film (resistor layer) 17 is sputtered by using a DC sputtering system and Si as a target while Ar gas is introduced. Instead of an Ar gas, a gas of $N_2$+Ar, $O_2$+Ar, or $N_2$+$O_2$+Ar may be used with reactive sputtering to form a resistor layer 17 of $SiN_x$, $SiO_x$ or $SiO_xN_y$ having an increased resistance value. Instead of sputtering, vapor deposition or plasma CVD may also be used for forming the resistor layer.

Figure 1K:
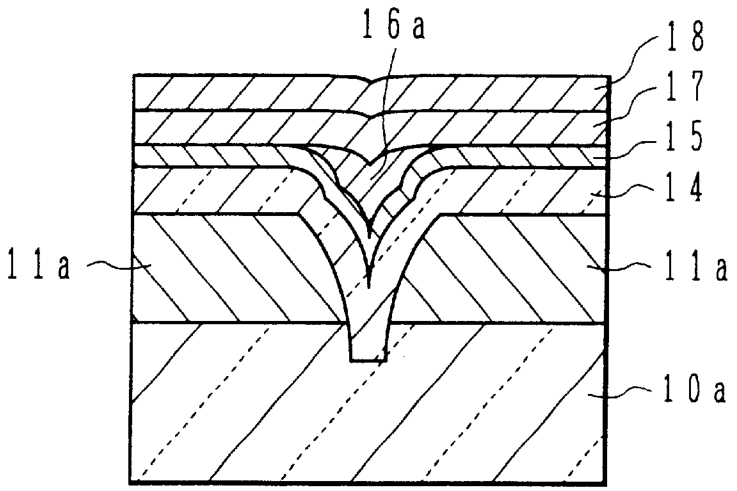

Next as shown in FIG. 1K, an emitter wiring layer 18 made of fourth conductive material such as Al is deposited on the resistor layer 17 to a thickness of about 0.5 μm by sputtering. For example, this sputtering is performed by using a DC sputtering system and Al as a target while Ar gas is introduced.

Figure 1L:
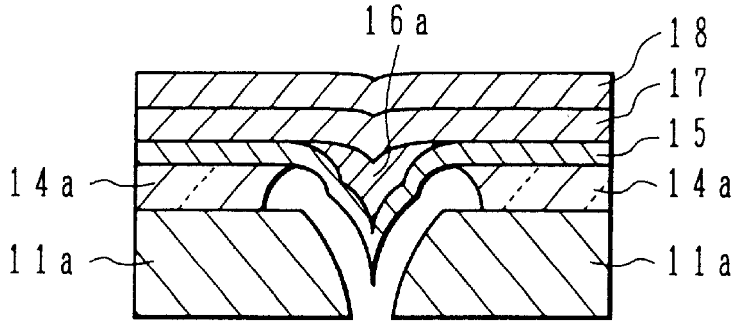

Lastly as shown in FIG. 1L, the substrate 10a and a portion of the first sacrificial film 14 are etched and removed to expose the gate electrode 11a and first emitter electrode 15 to complete a two-electrode element. For etching Si such as Si substrate, HF+$HNO_3$+$CH_3COOH$ is used, and for etching a silicon oxide film or the like, HF+$NH_4F$ is used.

The emitter electrode 15 having a two-stage shape has a sharp tip and can easily emit electrons. Since the skirt portion of the emitter electrode can be made to have a gentle slope, a process of filing emitter material becomes easy.

According to the first embodiment, similar to the emitter electrode the gate electrode 11a has a tapered side wall so that a distance between the gate electrode 11a and emitter electrode 15 can be made short. It is therefore possible to raise an electric field intensity at the tip of the emitter electrode and manufacture a field emission element having a low threshold voltage.

Also according to the first embodiment, the position in height (position in the vertical direction) of the emitter electrode is determined by the over-etch depth of the substrate 10 shown in FIG. 1D and the thickness of the first sacrificial film 14 shown in FIG. 1F. A distance between the emitter electrode 15 and gate electrode 11a is determined by the thickness of the first sacrificial film 14. The shape of the emitter electrode 15 and the tapered shape of the gate hole of the gate electrode 11a are determined by the reflow process shown in FIG. 1C and the etching process shown in FIG. 1D. By properly setting these parameters, the position in height of the emitter electrode, the shapes of the gate and emitter electrodes, a distance between the emitter and gate electrodes and the like can be controlled with good reproductivity.

It has been found from the experiments made by the inventor that a slope angle $\theta_r$ (an angle of a wall in the recess 13a relative to the substrate surface which angle is smaller than 90°) of the taper shaped recess 13a becomes smaller as the resist reflow temperature is set higher during the reflow process shown in FIG. 1C. This tendency becomes stronger the larger the diameter of the recess 13a. Namely, as the diameter becomes smaller, it becomes harder for the resist to soften. The thickness of the resist also influences the slope angle. If the resist is baked at the temperature of 180° C., the resist flows completely. In the range from 100 to 140° C., the slope angle is hard to be changed. It is therefore preferable to set the reflow temperature to a range higher than 140° C. and lower than 180° C., or more preferably a range from about 150° C. to 160° C. The temperature range may change depending upon the resist material.

Figure 13A:
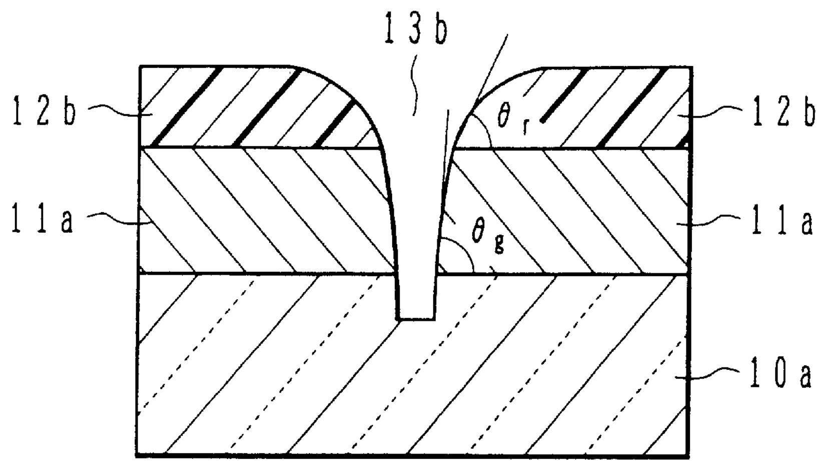
FIGS. 13A to 13C are cross sectional views of substrates illustrating a taper shape changed with a difference of an etching rate between resist and a gate electrode film.
Figure 13B:
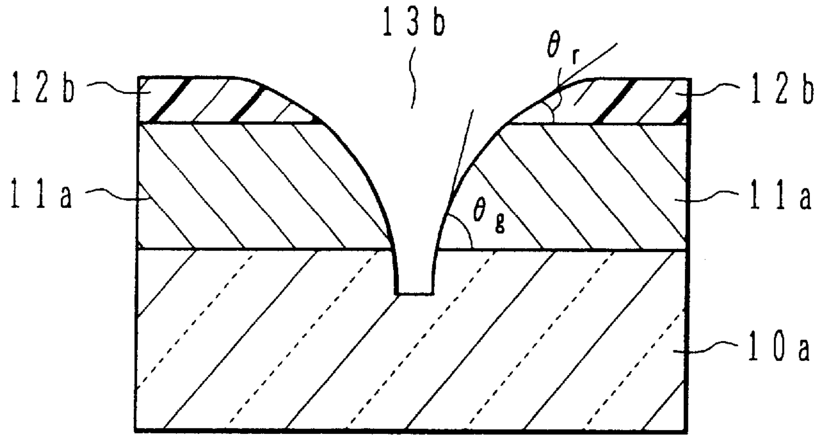
Figure 13C:
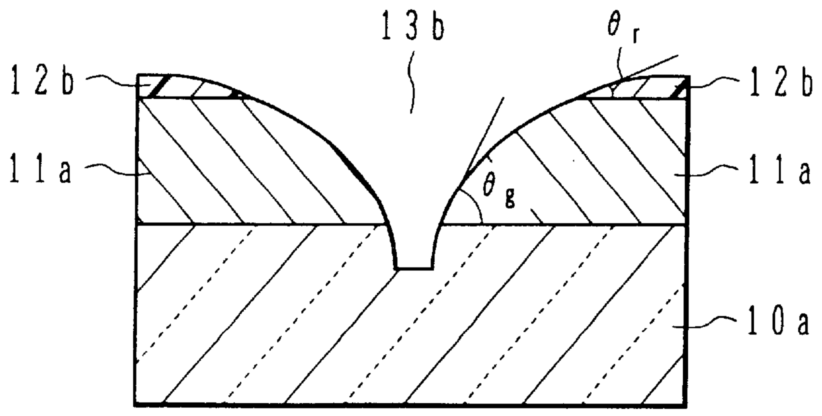

Experiment results of the etching process shown in FIG. 1D of this embodiment will be described with reference to FIGS. 13A to 13C. The tapered shape of the recess 13b is not only determined by the shape of the resist but also can be controlled by a selection ratio (etching rate ratio) during the etching process shown in FIG. 1D. FIGS. 13A to 13D show the tapered shapes obtained by the etching processes with different selection ratios made by the inventor. Rr represents an etching rate of the resist 12*b* and Rg represents an etching rate of the gate electrode film 11*a*.

The tapered shape shown in FIG. 13A was formed by an etching process under the condition of Rr<Rg. In this case, since a retraction (thickness reduction). of the resist during the etching process is small, the slope angle $\theta_g$ of the gate hole cross section of the gate electrode 11*a* is large.

The tapered shape shown in FIG. 13B was formed by an etching process under the condition of Rr=Rg (selection ratio=1). In this case, as compared to the tapered shape shown in FIG. 13A, the slope angle $\theta_g$ of the gate hole cross section of the gate electrode 11*a* becomes smaller. The tapered shape shown in FIG. 13C was formed by an etching process under the condition of Rr>Rg. In this case, the slope angle $\theta_g$ of the gate hole cross section of the gate electrode 11*a* becomes much smaller and the thickness of the left resist film 12*b* reduces. The preferable condition is as follows to obtain a preferable tapered shape.

$$20^\circ<\theta_r<80^\circ$$

$$0.2<(R_r/R_g)<5.0$$

$$0.5<(R_r/R_g)<2.0 \text{(more preferable)}$$

It is preferable that a melting point of the material of the gate electrode 11 and substrate 10 to be etched is higher than the reflow temperature of the resist. The material of the gate electrode film 11 satisfying this condition may be semiconductor such as polysilicon, metal such as W and Al and silicide such as $WSi_x$ and $TiSi_x$. A gate electrode film 11 whose upper and lower surfaces are laminated by an insulating film such as a silicon oxide film and a silicon nitride film or an antireflection film such as $TiN_x$ and $TiO_xN_y$ may be etched to form a tapered shape. The substrate 10 may be made of glass, quartz, silicon laminated with a silicon oxide film, aluminum laminated with an anodized aluminum film or the like.

FIGS. 2A to 2F are cross sectional views of a substrate illustrating the manufacture processes for a field emission element according to the second embodiment of the invention. Also in this embodiment, a two-electrode element having an emitter and gate is manufactured.

Figure 2A:
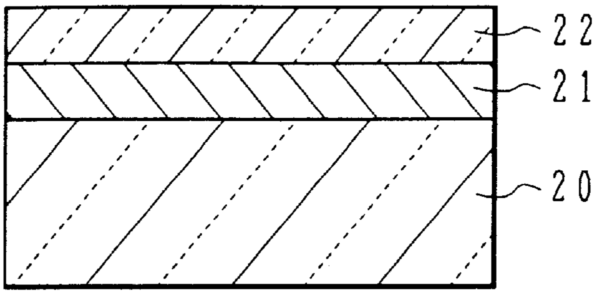
FIGS. 2A to 2F are cross sectional views of a substrate illustrating the manufacture processes for a field emission element (two-electrode element) according to a second embodiment of the invention.

Referring to FIG. 2A, a gate electrode film 21 made of first conductive material is formed on a single layer substrate 20 made of, for example, glass, quartz or the like or on a substrate 10 made of a lamination of an Si layer and a silicon oxide film formed thereon. The first material of the gate electrode film 21 is silicon doped with P (phosphorous) or B (boron) and deposited to a thickness of about 0.5 μm.

For example, the gate electrode film 21 made of silicon is formed under the conditions of a source gas of $SiH_4$ diluted with $H_e$, a substrate temperature of 625° C., and a reaction chamber pressure of 30 Pa. In order to lower the resistance value of the gate electrode film 21, P or B ions are diffused or implanted into the gate electrode film 21.

In order to improve the dielectric breakdown voltage between the gate and emitter electrodes and lower the capacitance therebetween, a first sacrificial film (insulating film) 22 of silicon nitride is deposited on the whole substrate surface to a thickness of 0.5 μm by low pressure CVD. For example, the low pressure CVD is performed under the conditions of a gas of $NH_3$ and $SiH_2Cl_2$, a substrate temperature of 750° C. and a temperature of 60 Pa. The silicon nitride film may be formed by plasma CVD or reactive sputtering.

In order to improve a size precision of a gate hole to be later formed, an antireflection film of $SiN_x$, $SiO_x$ and $TiN_x$ may be used as the first sacrificial film 22.

Instead of silicon nitride, the first sacrificial film 22 may be made of getter material such as Ti, Ta and zirconium in order to improve the vacuum degree near emitter elements of a field emission emitter array (flat panel display shown in FIG. 15) and suppress the attachment of molecules to the surface of the emitter electrode.

Figure 2B:
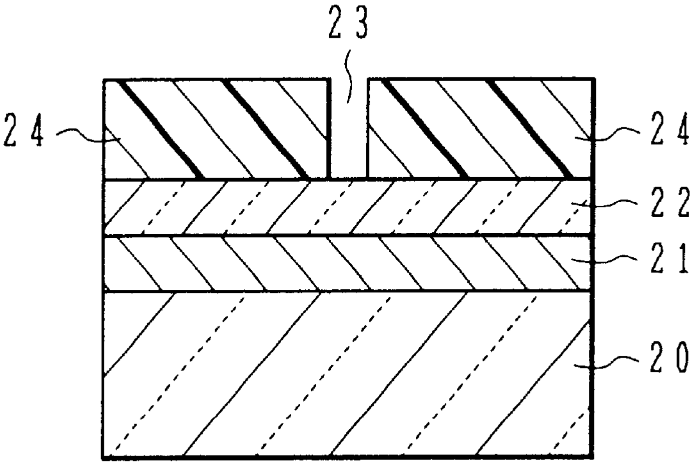
Figure 2C:
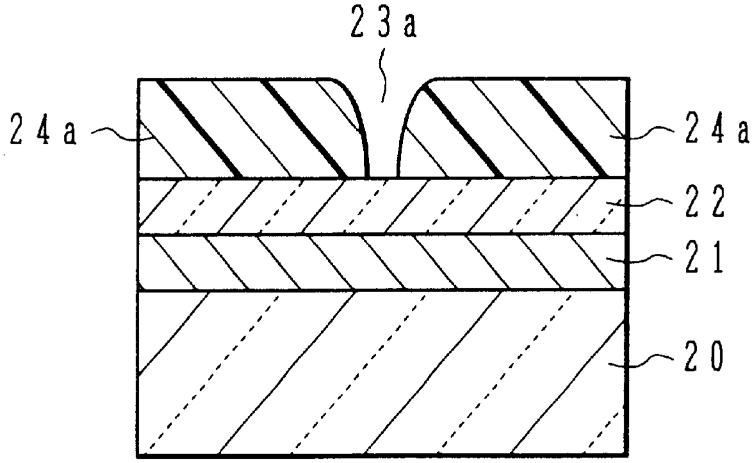

As shown in FIG. 2B, resist material is coated on the first sacrificial film 22 and etched through photolithography to form a resist pattern 24 having an opening 23 of about 0.45 μm in diameter at the surface level, by processes similar to those described with FIG. 1B.

Next, the resist pattern 24 is baked (reflowed), for example, by a hot plate (not shown) at a temperature of 150° C. for about 90 seconds to form a resist pattern 24*a* having a recess 23*a* with a gentle slope upper corner as shown in FIG. 1C. The recess 23*a* has a gentle taper shape in cross section having an inter diameter large at the higher level and gradually making small toward a lower level.

Figure 2D:
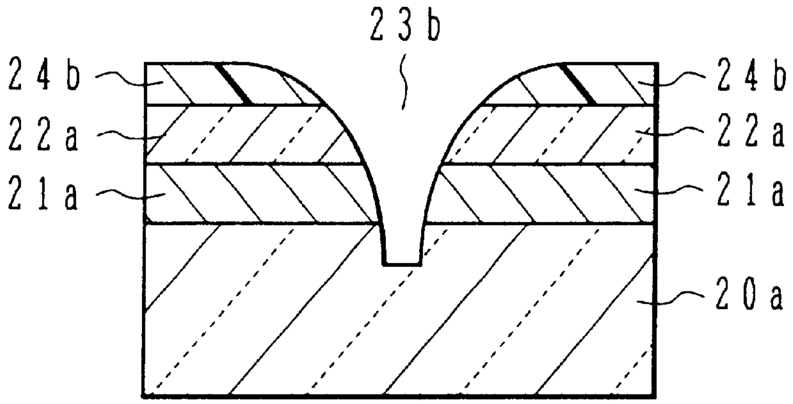

Next, by using the reflowed resist pattern 24*a* as a mask, the gate electrode film 21 made of the first conductive material and the first sacrificial film 22 are etched to form a recess (gate hole) 23*b* having a gentle tapered side wall as shown in FIG. 2D. This etching is an over-etch to etch the substrate 20 by about 0.1 μm in depth from the surface of the substrate 20 and form a substrate 20*a* having a recess. The depth of this recess influences the length of an emitter electrode to be later formed. The diameter of the recess 23*b* of the gate electrode film 21*a* is about 0.5 μm at the bottom and about 0.7 μm at the upper level, and the depth is about 0.5 μm.

For example, this etching is performed by using a magnetron RIE system under the conditions of an etching gas of $CO_2$+$CHF_3$+Ar and a reaction chamber pressure of 125 mTorr. Etching rates of the gate electrode film 21, the first sacrificial film 22 and the resist pattern 24*a* are about 1.2 μm/min, 1.2 μm/min and 0.8 μm/min, respectively.

Figure 2E:
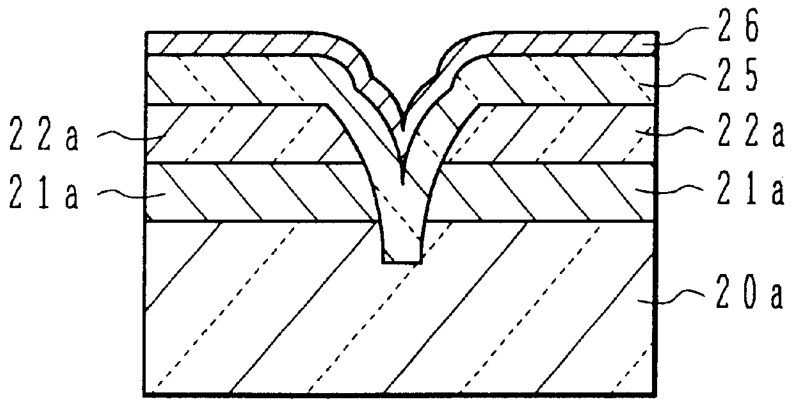

Next, by using processes similar to those described with reference to FIGS. 1E to. 1G of the first embodiment, the left resist 24*b* is removed, and thereafter as shown in FIG. 2E, a second sacrificial film (insulating film) 25 of silicon oxide is deposited on the whole substrate surface to a thickness of 0.15 μm by atmospheric pressure CVD, and a first emitter electrode film 26 of second conductive material such as $TiN_x$ is deposited on the second sacrificial film 25 to a thickness of 0.05 μm by reactive sputtering.

Figure 2F:
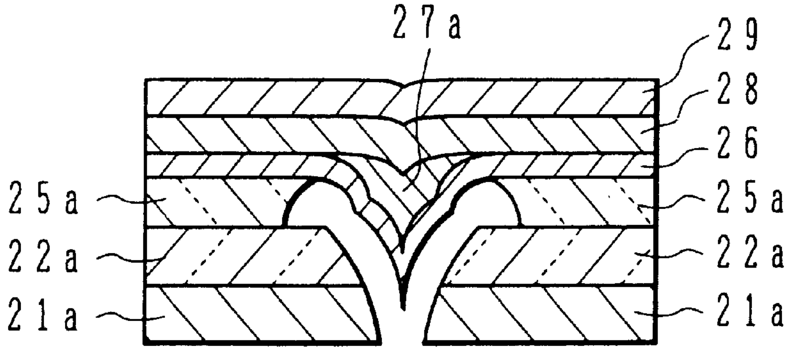

Next, after performing processes similar to those described with reference to FIGS. 1H to 1K of the first embodiment, a blanket film 27*a*, a resistor film 28 and an emitter wiring layer 29 are sequentially laminated as shown in FIG. 2F. Lastly, similar to the process shown in FIG. 1L, the substrate 20*a* and a portion of the second sacrificial film 25 are etched and removed to expose the gate electrode 21*a* and emitter electrode 26 to complete a two-electrode element.

According to the second embodiment, by using the first and second sacrificial films 22*a* and 25*a* made of insulating material are used to make the gate electrode 21*a* thinner than that of the first embodiment. Therefore, the capacitance between the gate and emitter electrodes becomes small and the dielectric breakdown voltage between the gate and emitter electrodes can be improved.

Figure 3A:
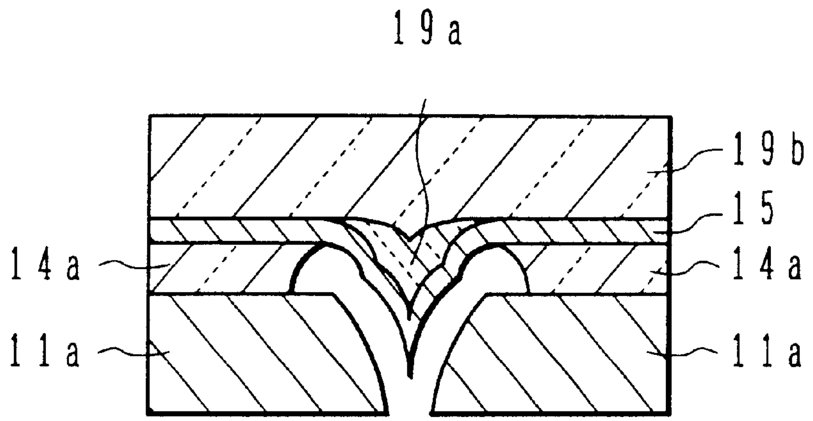
FIGS. 3A to 3C are cross sectional views of the substrates of field emission elements according to a modification of the first embodiment.
Figure 3B:
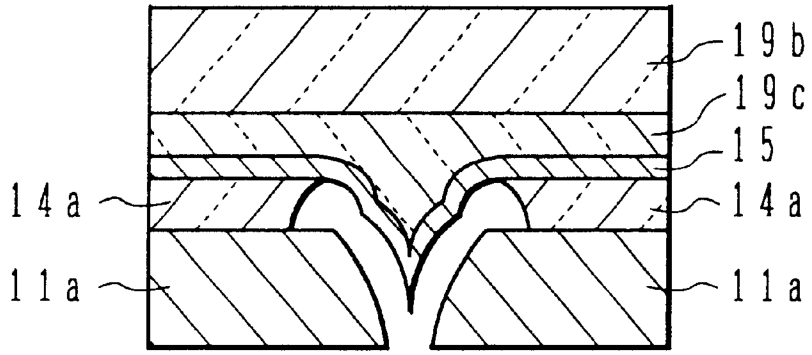
Figure 3C:
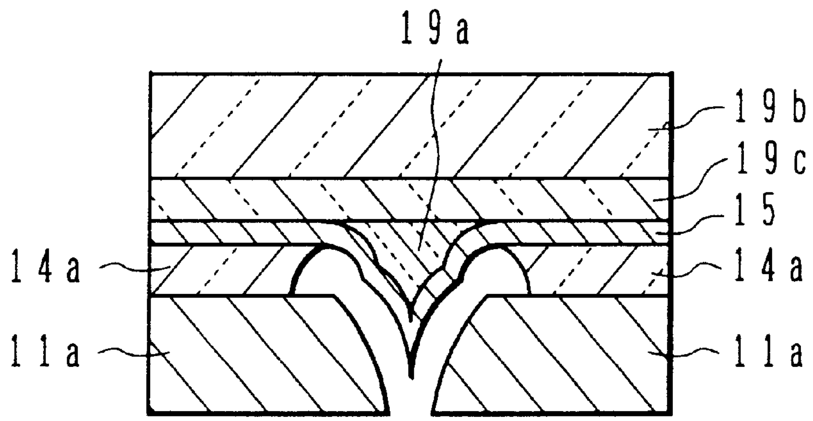

FIGS. 3A to 3C illustrate methods of reinforcing the emitter electrode with a support substrate according to a modification of the first embodiment.

With the method shown in FIG. 3A, a recess on the surface of the emitter electrode of the element subjected to the processes shown in FIGS. 1A to 1G of the first embodiment is filled with a planarizing layer 19*a* made of, for example, spin-on-glass (SOG). Thereafter, the surface of the planarizing film 19*a* is planarized by chemical mechanical polishing (CMP) or whole surface etching. Then, a support substrate 19*b* is adhered to the planarizing film 19*a* by electrostatic adhesion or by using adhesive.

Thereafter, the unnecessary portions such as substrate 10*a* are etched and removed by a process similar to the etching process shown in FIG. 1L, to expose the gate electrode 11*a* and emitter electrode 15 as shown in FIG. 3A and complete a two-electrode element.

Also with the method shown in FIG. 3B, the emitter electrode 15 of the element subjected to the processes shown in FIGS. 1A to 1G of the first embodiment is adhered to a support substrate 19*b* by using adhesive 19*c* such as low melting point glass.

Thereafter, the unnecessary portions such as substrate 10*a* are etched and removed by a process similar to the etching process shown in FIG. 1L, to expose the gate electrode 11*a* and emitter electrode 15 as shown in FIG. 3B and complete a two-electrode element.

With the method shown in FIG. 3C, a recess on the surface of the emitter electrode of the element subjected to the processes shown in FIGS. 1A to 1G of the first embodiment is filled with a planarizing layer 19*a* made of, for example, SOG. Thereafter, the surface of the planarizing film 19*a* is planarized by CMP. Then, a support substrate 19*b* is adhered to the planarizing film 19*a* and emitter electrode 15 by using adhesive 19*c* such as low melting point glass.

Thereafter, the unnecessary portions such as substrate 10*a* are etched and removed by a process similar to the etching process shown in FIG. 1L, to expose the gate electrode 11*a* and emitter electrode 15 as shown in FIG. 3C and complete a two-electrode element.

Figure 4:
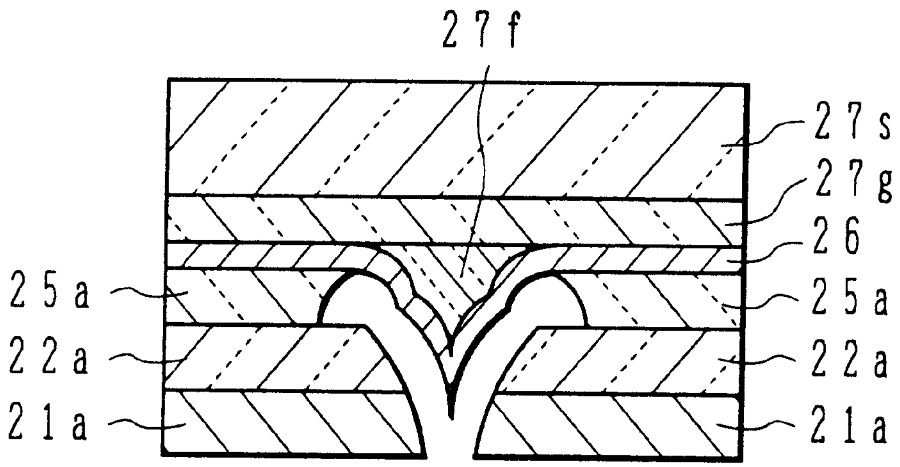
FIG. 4 is a cross sectional view of the substrate of a field emission element according to a modification of the second embodiment.

FIG. 4 illustrates a method of reinforcing the emitter electrode with a support substrate according to a modification of the second embodiment.

With the method shown in FIG. 4, a recess on the surface of the emitter electrode 26 of the element subjected to the processes shown in FIGS. 2A to 2E of the second embodiment is filled with a planarizing layer 27*f* made of, for example, SOG. Thereafter, the surface of the planarizing film 27*f* is planarized by CMP or whole surface etching. Then, a support substrate 27*s* is adhered to the emitter electrode 26 and planarizing film 27*f* by using adhesive 27*g* such as low melting glass.

Thereafter, the unnecessary portions such as substrate 20*a* are etched and removed by a process similar to the etching process shown in FIG. 2F, to expose the gate electrode 21*a* and emitter electrode 26 as shown in FIG. 4 and complete a two-electrode element. FIGS. 5A to 5H are cross sectional views of a substrate illustrating the manufacture processes for a field emission element (three-electrode element) according to the third embodiment of the invention. The three-electrode element of the third embodiment has tree electrodes, an emitter electrode, a gate electrode and an anode electrode.

Figure 5A:
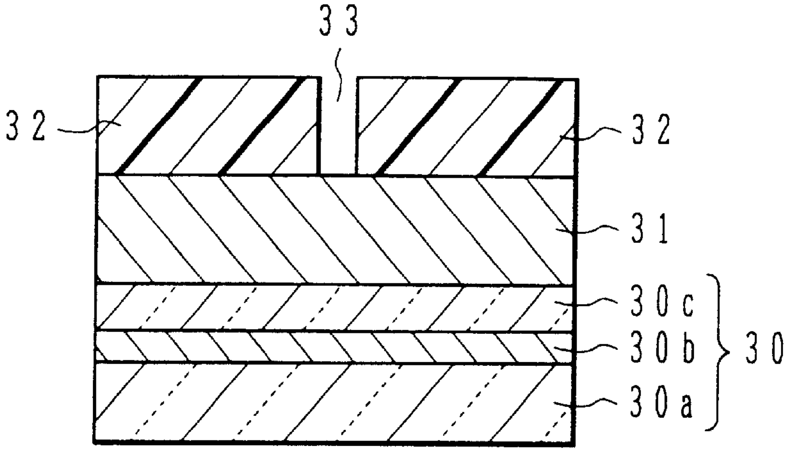
FIGS. 5A to 5H are cross sectional views of a substrate illustrating the manufacture processes for a field emission element according to a third embodiment of the invention.

Referring to FIG. 5A, a substrate 30 is formed by depositing an anode electrode film 30*b* made of first conductive material to a thickness of 0.1 μm by low pressure CVD, on either a single layer substrate 30*a* made of, for example, glass, quartz or the like or on a substrate 30*a* made of a lamination of an Si layer and a silicon oxide film formed thereon, and by forming a first sacrificial film (insulating film) 30*c* made of silicon oxide on the anode electrode film 30*b* to a thickness of 0.1 μm by atmospheric pressure CVD.

In this case, the first conductive material of the anode electrode 30*b* is silicon doped with P or B in order to lower the resistance value. The anode electrode 30*b* is formed under the conditions of a source gas of $SiH_4$ diluted with He, a substrate temperature of 625° C. and a reaction chamber pressure of 30 Pa. The first sacrificial film 30*c* is formed under the conditions of a source gas of $O_3$ and TEOS. and a substrate temperature of 400° C.

On the first sacrificial film 30*c* of the substrate 30 formed as above, a gate electrode film made of second conductive material is formed. The second conductive material of the gate electrode film 31 is made of silicon doped with P (phosphorous) or B (boron) and deposited to a thickness of about 0.3 μm. For example, this gate electrode film 31 made of silicon is formed by low pressure CVD under the conditions of a source gas of $SiH_4$ diluted with He, a substrate temperature of 625° C. and a reaction chamber pressure of 30 Pa. In order to lower the resistance value of the gate electrode film 31, P or B ions are diffused or implanted into the gate electrode film 31.

Further, as shown in FIG. 5A, resist material is coated on the gate electrode film 31 and etched through photolithography to form a resist pattern 32 having an opening 33 of about 0.45 μm in diameter at its surface.

For example, i-line (365 nm) resist THMR-iP3100 manufactured by Tokyo Ohka Kogyo Co. Ltd. is coated to a thickness of about 0.5 μm. In order to improve the size precision of the resist pattern 32, it is preferable to coat AZ-AQUATAR manufactured by Clariant (Japan) K.K. to a thickness of about 0.064 μm the resist material as a coated antireflection film.

The resist is exposed to light by using an i-line stepper NSR2005i11D manufactured by Nikon Corp. and a reticle having a predetermined pattern under the conditions of NA=0.57 and sigma=0.4. Thereafter, the resist is developed for 60 seconds by using NMD-3 (TMAH: tetra methyl ammonium hydroxide 2.38%) manufactured by Tokyo Ohka Kogyo Co., Ltd., and thereafter rinsed with pure water.

Figure 5B:
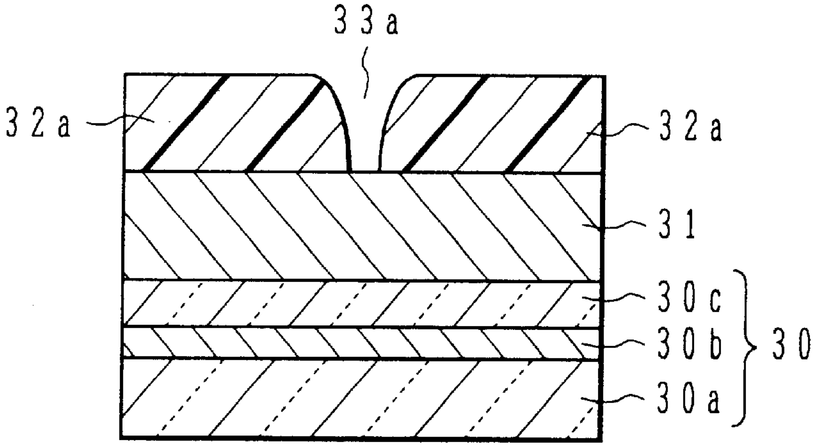
Figure 5C:
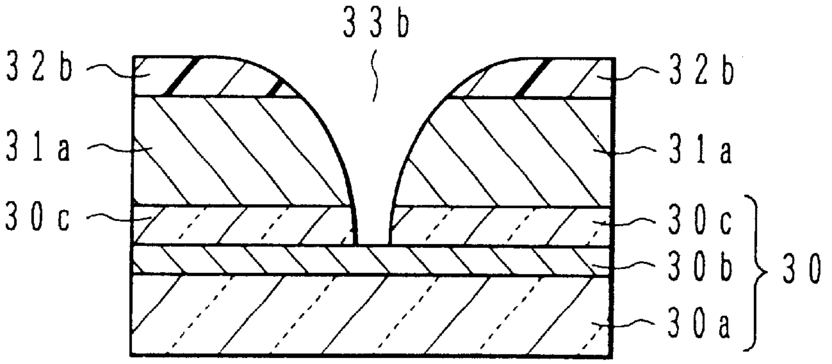

Next, the resist pattern 32 is baked (reflowed), for example, by a hot plate (not shown) at a temperature of 150° C. for about 90 seconds to form a resist pattern 32*a* having a recess 33*a* with a gentle slope upper corner as shown in FIG. 5B. The recess 33*a* has a taper shape in cross section having an inter diameter large at the higher level and gradually making small toward a lower level.

Next, by using the reflowed resist pattern 32*a* as a mask, the gate electrode film 31 made of silicon and first sacrificial film 30*c* are etched to form a recess (gate hole) 33*b* having a gentle tapered side wall. It is preferable to over-etch the substrate 30 by about 0.1 μm (corresponding to a thickness of the first sacrificial film 30*c*) in depth from the surface of the substrate 30 to form a substrate 30 having a recess. The depth of the recess influences the height and length of an emitter electrode to be later formed.

For example, this etching is performed by using a magnetron RIE system under the conditions of an etching gas of $CO_2$+$CHF_3$+Ar and a reaction chamber pressure of 125 mTorr. Etching rates of the gate electrode film 31 and the resist pattern 32*a* are about 1.2 μm /min an 0.8 μm/min, respectively.

Figure 5D:
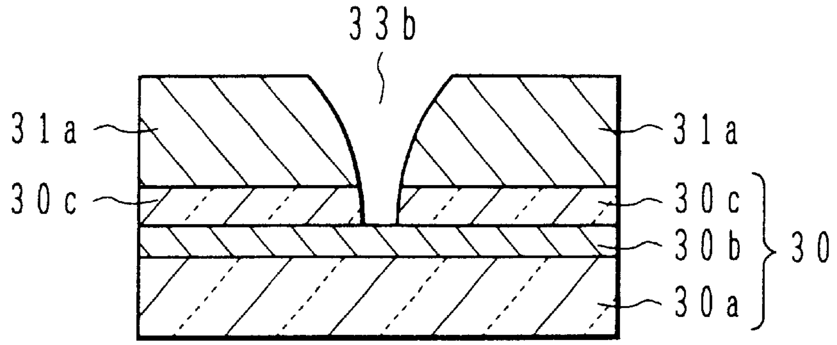
Figure 5E:
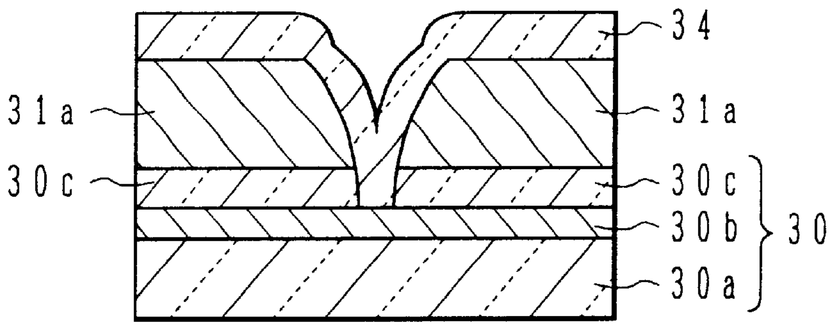

Next, as shown in FIG. 5D, the leftover resist 32*b* is removed. For example, in order to remove the resist 32*b*, $H_2SO_4$+$H_2O_2$ heated to 140° C. is used. Shing by oxygen plasma or remover such as N-methyl-2-pyrrolidone may also be used Next as shown in FIG. 5E, a second sacrificial film (insulating film) 34 of silicon oxide is isotropically deposited on the whole substrate surface to a thickness of 0.3 μm by atmospheric pressure CVD. For example, the second sacrificial film 34 is formed under the conditions of a source gas of $O_3$ and TEOS and a substrate temperature of 400° C. Under these conditions, the second sacrificial film 34 is deposited inheriting (conformal to) the side wall surface shape of the recess 33*b*.

Figure 5F:
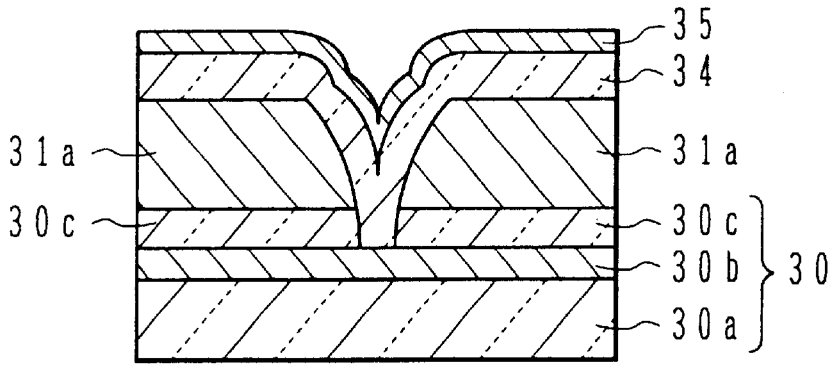

Next as shown in FIG. 5F, an emitter electrode film 35 of third conductive material such as $TiN_x$ is isotropically deposited on the second sacrificial film 34 to a thickness of 0.05 $\mu$m by reactive sputtering. This reactive sputtering is performed by using a DC sputtering system and Ti as a target while a gas of $N_2$ and Ar is introduced. The emitter electrode film 35 is therefore formed inheriting (conformal to) the surface shape of the second sacrificial film 34.

Next, a resist mask (not shown) having a predetermined opening is formed on the whole surface of the emitter electrode film 35 by using ordinary photolithography. A portion of the emitter electrode 35 not used as the cathode is etched and removed through the opening to form a slit opening 36 shown in FIG. 5G. For example, this etching is performed by using a magnetron RIE system under the conditions of a gas of $Cl_2$ and a reaction chamber pressure of 125 mTorr. On the second sacrificial film 34, emitter electrodes 35*a* and 35*b* having predetermined patterns as viewed in cross section are therefore left.

Figure 5G:
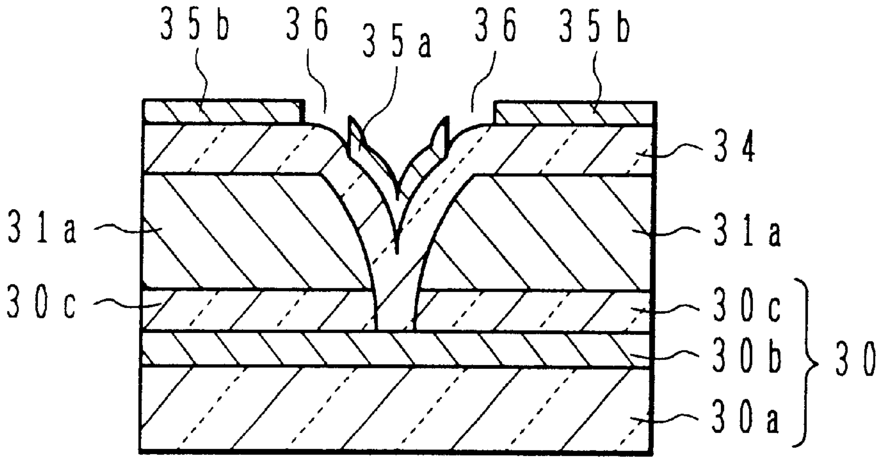
Figure 5H:
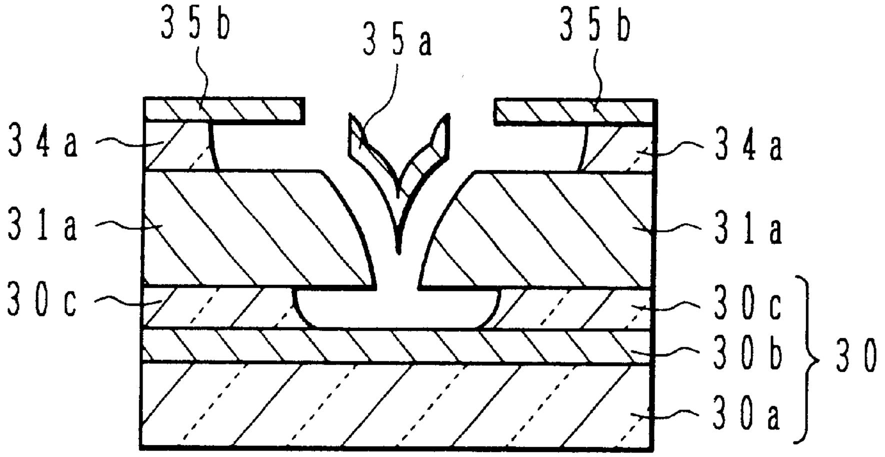

Next, via the slit opening 36, portions of the second and first sacrificial films 34 and 30c are etched to expose the gate electrode 31*a*, emitter electrode 35*a* and anode electrode 30*b* and complete a three-electrode element as shown in FIG. 5H. For etching the first and second sacrificial films 30*c* and 34 of silicon oxide, $HF+NH_4F$ is used.

The three-electrode element has the emitter electrode as a cathode and the anode electrode 30 as a plate. As a positive potential having a predetermined value is applied to the gate electrode, an electron beam is emitted from the emitter electrode 35*a* toward the anode electrode 30*b* while being converged.

Figure 6A:
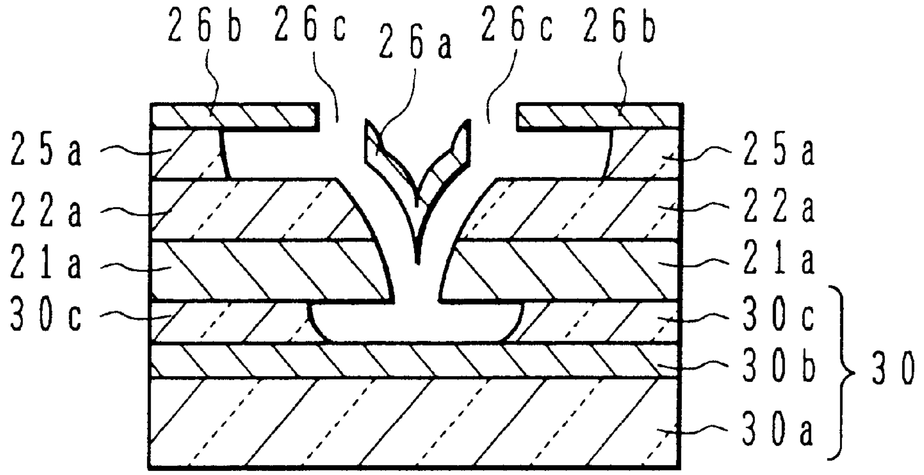
FIGS. 6A and 6B are cross sectional views of the substrates of field emission elements according to a modification of the third embodiment.

FIG. 6A shows a three-electrode element modified from a two-electrode element of the second embodiment. The manufacture method and structure of a substrate are the same as the third embodiment shown in FIG. 5A. By using processes similar to those shown in FIGS. 2A to 2E, an Si gate electrode film 21*a*, an $SiN_x$ second sacrificial film 22*a*, an $SiO_2$ third sacrificial film 25 and a $TiN_x$ emitter electrode 26 are formed on the substrate 30.

Next, by using a process similar to that shown in FIG. 5G, a resist mask (not shown) having a predetermined opening is formed on the whole surface of the emitter electrode film 26 by using ordinary photolithography. A portion of the emitter electrode 26*a* not used as the cathode is etched and removed through the opening to form a slit opening 26*c* shown in FIG. 6A. Next, by using a process similar to that shown in FIG. 5H, via the slit opening 26*c*, portions of the third and first sacrificial films 25*a* and 30*c* are etched to expose the gate electrode 21*a*, emitter electrode 26*a* and anode electrode 30*b* and complete a three-electrode element.

Figure 6B:
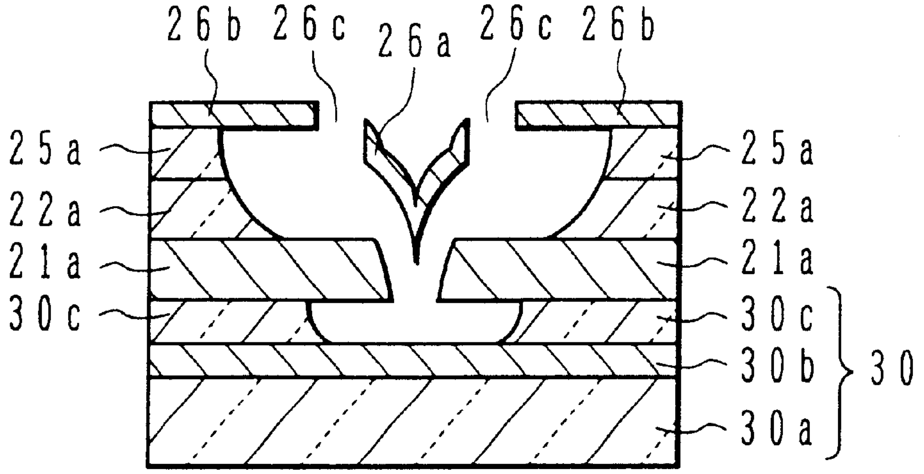

FIG. 6B shows another example of a three-electrode element modified from a two-electrode element of the second embodiment. The structure different from that shown in FIG. 6A is that the second sacrificial film 22*a* is made of the same material $SiO_2$ as the material of the first and third sacrificial films 30*c* and 25*a*.

By using a process similar to that shown in FIG. 5G, a resist mask (not shown) having a predetermined opening is formed on the whole surface of the emitter electrode film 26 by using ordinary photolithography. A portion of the emitter electrode 26 not used as the cathode is etched and removed through the opening to form a slit opening 26*c* shown in FIG. 6B. Next, by using a process similar to that shown in FIG. 5H, via the slit opening 26*c*, portions of the third, second and first sacrificial films 25*a*, 22*a* and 30*c* are etched. In this case, since the third, second and first sacrificial films 25*a*, 22*a* and 30*c* are made of the same silicon oxide material, the etching rates are the same. Since the unnecessary portions are removed, the gate electrode 21*a*, emitter electrode 26*a* and anode electrode 30*b* are exposed and a three-electrode element is completed as shown in FIG. 6B.

FIG. 7A to 7L are cross sectional views of a substrate illustrating the manufacture processes for a field emission element according to the fourth embodiment of the invention. In the embodiment, the manufacture processes for a two-electrode element having an emitter (field emission cathode) and a gate will be described.

In the first to third embodiments, a tapered recess is formed by heating a resist film and by using this tapered shape an emitter electrode is formed. In the fourth embodiment to be described hereinunder, instead of the resist film, a reflow film made of low melting material (material having a melting point lower than that of electrode material and other materials of layers laminated on the upper and lower surfaces of each electrode layer) is used to form a tapered recess, and an emitter electrode is formed by using this recess.

Figure 7A:
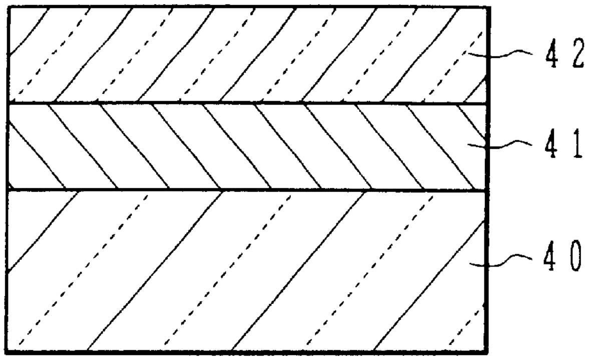
FIGS. 7A to 7L are cross sectional views of a substrate illustrating the manufacturing processes for a field emission element according to a fourth embodiment of the invention.

Referring to FIG. 7A, a gate electrode film 41 made of first conductive material is formed on a single layer substrate 40 made of, for example, quartz or the like or on a substrate 40 made of a lamination of an Si layer and a silicon oxide film formed thereon. The first conductive material of the gate electrode film 41 is silicon doped with P (phosphorous) or B (boron) and deposited to a thickness of about 0.3 $\mu$m by low pressure CVD.

For example, the gate electrode film 41 made of silicon is formed under the conditions of a source gas of $SiH_4$ diluted with He, a substrate temperature of 625° C. and a reaction chamber pressure of 30 Pa. In order to lower the resistance value of the gate electrode film 41, P or B impurity ions are diffused or implanted into the gate electrode film 41.

A low melting point film (low temperature reflow film) 42 is formed on the gate electrode film 41. For example, the low melting point film 42 is made of phosphosilicate glass (PSG) deposited to a thickness of about 0.5 $\mu$m. Instead of PSG, other low melting glass may be used such as borophosphosilicate glass (BPSG), borosilicate glass (BSG), arsenoslilicate glass (AsSG), arsenophosphosilicate glass (AsPSG) and phosphogermanosilicate glass (PGSG), frit glass, covar, solder, Si—Ge, or low melting point metal. The low melting point film may be a single layer film or a lamination film. If a low melting point film having a lamination structure is used, the material of the uppermost layer thereof is selected to have a lowest melting point.

Figure 7B:
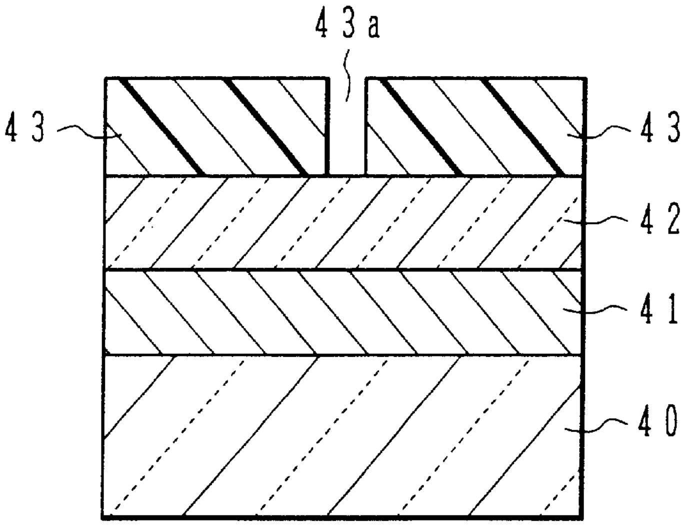

Next as shown in FIG. 7B, photoresist material is coated on the low melting point film 42 and etched through photolithography to form a resist pattern 43 having an opening 43*a* of about 0.45 $\mu$m in diameter at its surface level. This resist pattern 43 having the opening 43*a* is formed by the following processes.

For example, i-line (365 nm) resist THMR-iP3100 manufactured by Tokyo Ohka Kogyo Co. Ltd. is coated to a thickness of about 0.1 $\mu$m as the material of the resist pattern 43. In order to improve the size precision of the resist pattern 43, it is preferable to coat AZ-AQUATAR manufactured by Clariant (Japan) K.K. to a thickness of about 0.064 $\mu$m on the resist material as a coated antireflection film.

The resist is exposed to light by using an i-line stepper NSR2005i11D manufactured by Nikon Corp. and a reticle having a predetermined pattern under the conditions of NA=0.57 and sigma =0.4. Thereafter, the. resist is developed for 60 seconds by using NMD-3 (TMAH: tetra methyl ammonium hydroxide) manufactured by Tokyo Ohka Kogyo Co., Ltd., and thereafter rinsed with pure water.

Figure 7C:
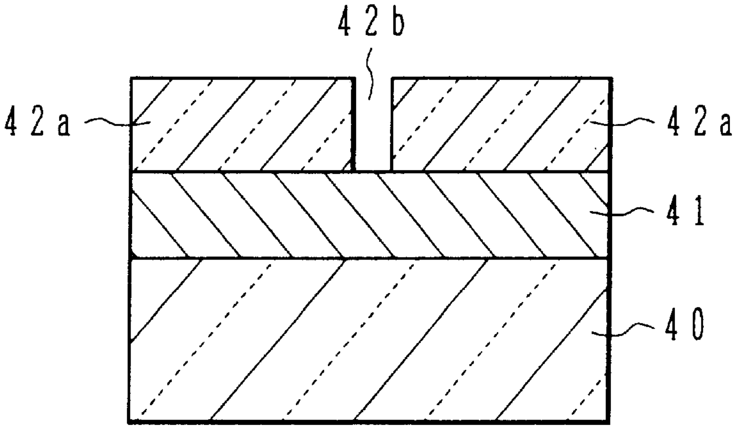

Next, by using the resist pattern 43 as a mask, the low melting point film 42 is anisotropically etched to form a low melting point film 42*a* having an opening 42*b* as shown in FIG. 7C. This opening 42*b* has a vertical or a generally vertical side wall reaching the gate electrode film 41. For example, this etching is performed by using a magnetron RIE under the conditions of an etching gas of $CHF_3$+$CO_2$+Ar+He and a reaction chamber pressure of 50 mTorr. After the etching, the leftover resist is removed. In order to prevent the resist from being softened during the etching, it is preferable to cool the bottom surface of the substrate 40 with He.

Figure 7D:
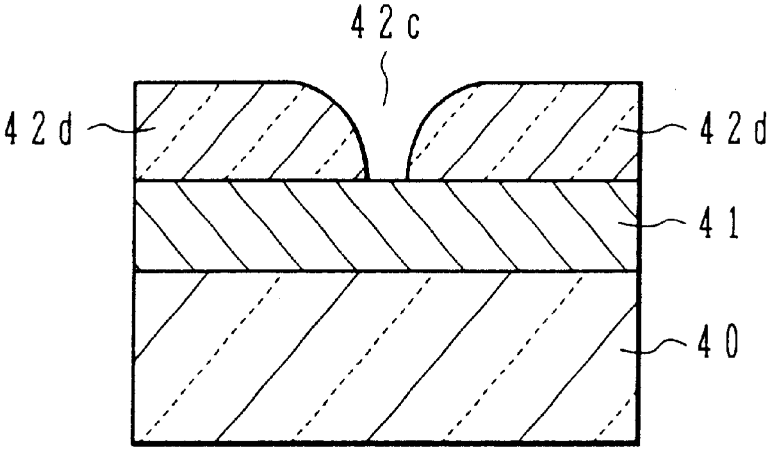

Next, the low melting point film 42*a* is heated and reflowed to form a low melting point film pattern 42*d* having a tapered recess 42*c* with a gentle slope upper corner or shoulder, as shown in FIG. 7D. For example, this reflow process is performed by using a furnace under the conditions of an atmosphere of $N_2$ and a temperature of 1000° C. for about 30 minutes. Lamp heating or laser heating may also be used. The specific conditions and the like of the reflow process will be detailed with reference to the accompanying drawings after the description of the processes of this embodiment.

Figure 7E:
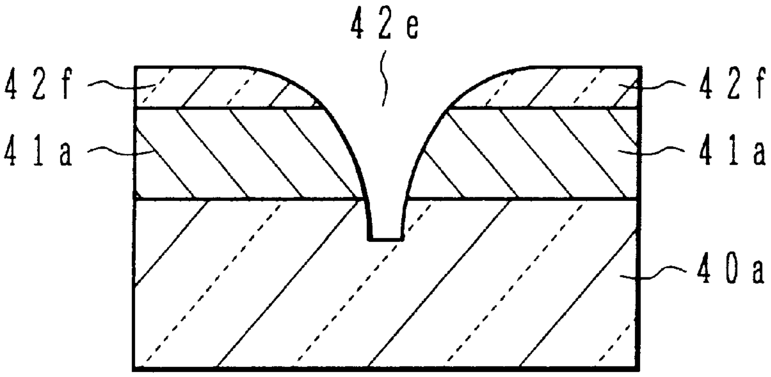

Next, by using the reflowed low melting point film pattern 42*d* as a mask, the gate electrode film 41 made of the first conductive material is etched to form a recess (gate hole) 42*e* having a gentle tapered side wall, as shown in FIG. 7E and to form a reduced thickness low melting point film pattern 42*f*. This etching is an over-etch to etch the substrate 40 by about 0.1 μm in depth from the surface of the substrate 40 to form a substrate 40*a* having a recess. The depth of this recess influences the length and height of an emitter electrode to be later formed. The diameter of the recess 42*e* of the gate electrode film 41*a* is about 0.51 μm at the bottom and about 0.7 μm at the upper level, and the depth is about 0.3 μm. The depth of this recess influences the length and height of an emitter electrode to be later formed. The diameter of the recess 42*e* of the gate electrode film 41*a* is about 0.5 μm at the bottom and about 0.7 μm at the upper level, and the depth is about 0.3 μm.

For example, this etching is performed by using a magnetron RIE system under the conditions of an etching gas of $CO_2$+$CHF_3$+Ar and a reaction chamber pressure of 125 mTorr. Etching rates of the gate electrode film 41 and the low melting point film pattern 42*d* are about 1.2 μm/min and 1.0 μm/min, respectively.

Figure 7F:
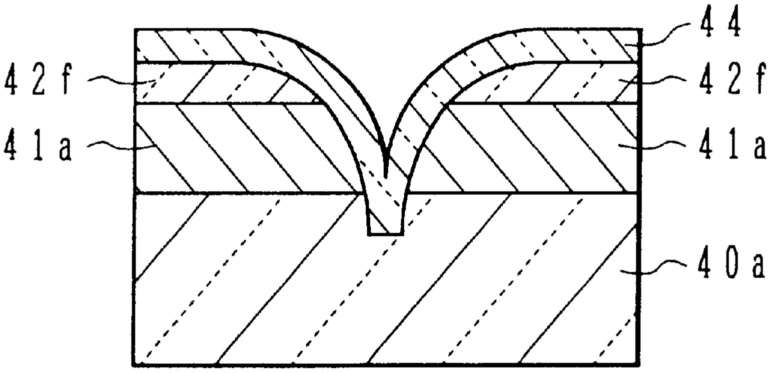

Next, as shown in FIG. 7F, a first sacrificial film (insulating film) 44 of silicon oxide is isotropically deposited on the whole substrate surface to a thickness of 0.3 μm by atmospheric pressure CVD. For example, the first sacrificial film 44 is formed under the conditions of a source gas of $O_3$ and TEOS and a substrate temperature of 400° C. Under these conditions, the first sacrificial film 44 is deposited inheriting (conformal to) the side wall surface shape of the recess 42*e*.

Figure 7G:
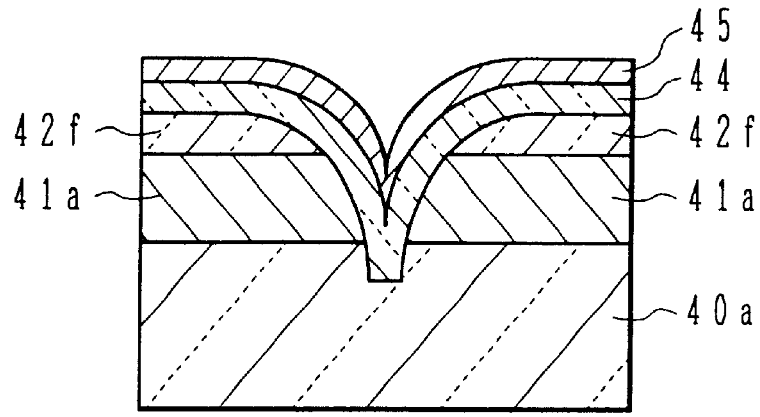

Next as shown in FIG. 7G, a first emitter electrode film 45 of second conductive material such as $TiN_x$ is isotropically deposited on the first sacrificial film 44 to a thickness of 0.05 μm by reactive sputtering. This reactive sputtering is performed by using a DC sputtering system and Ti as a target while a gas of $N_2$+Ar is introduced. The first emitter electrode film 45 is therefore formed inheriting (conformal to) the surface shape of the first sacrificial film 44.

Figure 7H:
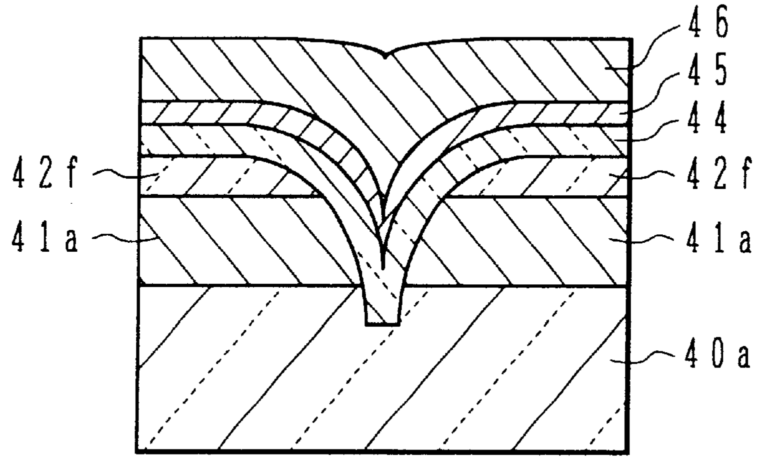

Next, as shown in FIG. 7H, a second emitter electrode film 46 made of third conductive material is deposited on the first emitter electrode film 45 to a thickness of 0.2 μm, the second electrode film 46 serving as a blanket film. For example, the third conductive material is W and is deposited by CVD under the condition of a gas of $WF_6$+$H_2$+$N_2$+Ar, a pressure of 80 Torr and a temperature of 450° C.

Figure 7I:
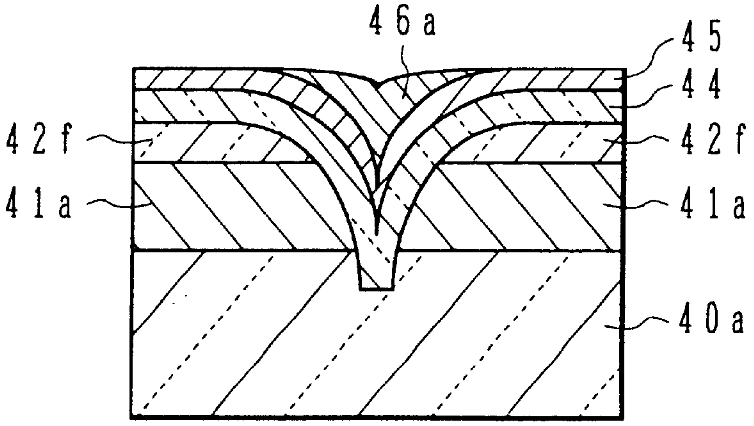

Next, as shown in FIG. 7I, the second emitter electrode film 46 is etched back by 0.2 μm in thickness to leave only a blanket film 46*a*. The etch-back is performed by using an RIE system under the conditions of an etching gas of $SF_6$+Ar+He and a reaction chamber pressure of 280 mTorr.

Figure 7J:
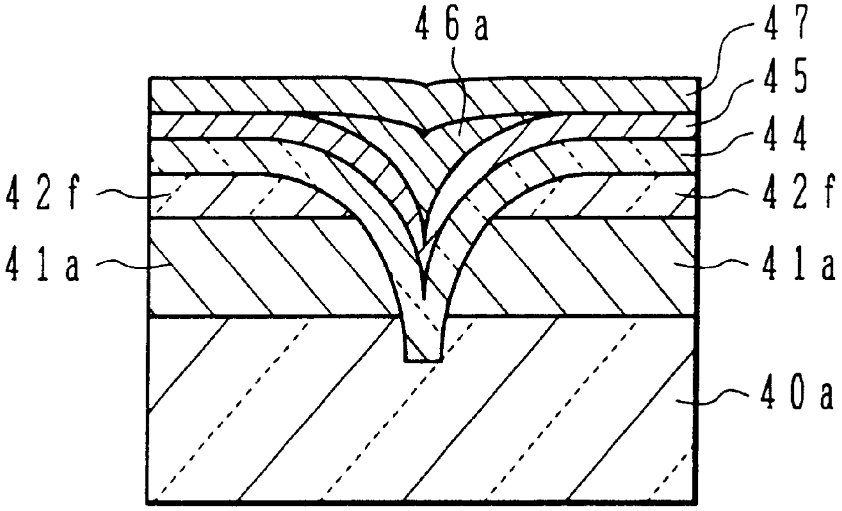

It is known that in order to sufficiently stabilize an emission current from a field emission cathode (emitter), a resistor layer is connected serially to the emitter. As shown in FIG. 7J, therefore, a resistor layer 47 of silicon is deposited to a thickness of about 0.2 μm on the first emitter electrode 45 and blanket film 46*a* by sputtering.

The resistor layer 47 is sputtered by using a DC sputtering system and Si as a target while Ar gas is introduced. Instead of an Ar gas, a gas of $N_2$+Ar, $O_2$+Ar, or $N_2$+$O_2$+Ar may be used with reactive sputtering to form a resistor layer 47 of $SiN_x$, $SiO_x$ or $SiO_xN_y$ having an increased resistance value. Instead of sputtering, vapor deposition or plasma CVD may also be used for forming the resistor layer.

Figure 7K:
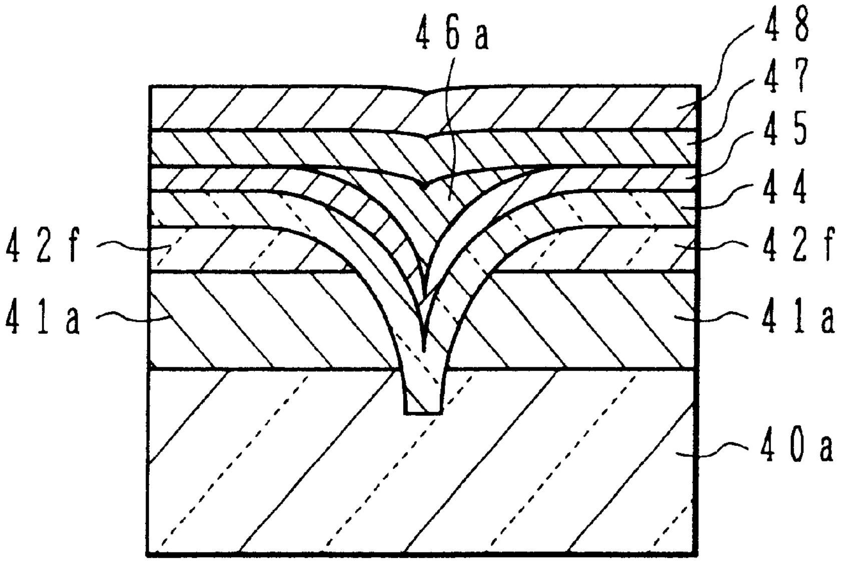

Next as shown in FIG. 7K, an emitter wiring layer 48 made of fourth conductive material such as Al is deposited on the resistor layer 47 to a thickness of about 0.5 μm by sputtering. For example, this sputtering is performed by using a DC sputtering system and Al as a target while Ar gas is introduced.

Figure 7L:
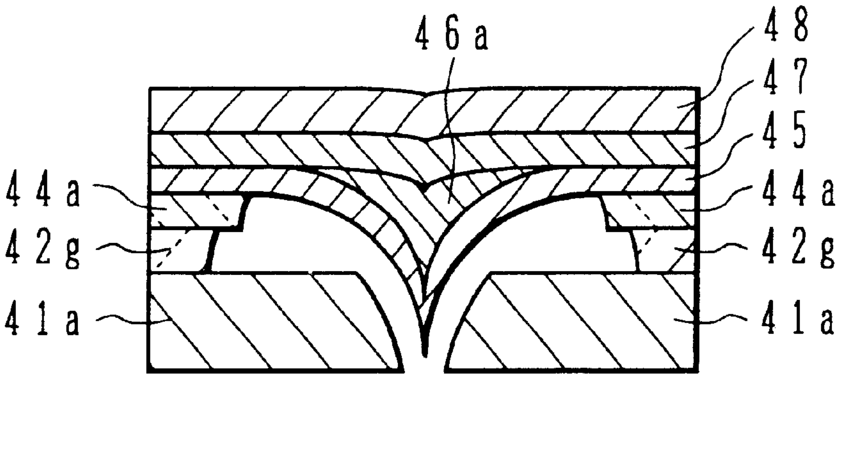

Lastly as shown in FIG. 7L, the substrate 40*a* and portions of the first sacrificial film 44 and low melting point film $\mathbf{42}_b$ are etched and removed from the bottom side to expose the gate electrode 41*a* and first emitter electrode 45 to complete a two-electrode element. For etching Si such as the Si substrate 40*a*, HF+$HNO_3$+$CH_3COOH$ is used, and for etching a silicon oxide film, PSG (low melting point film) or the like, HF+$NH_4F$ is used.

The effects of the fourth embodiment are similar to those of the first to third embodiments. According to the fourth embodiment, similar to the emitter electrode 45, the gate electrode 41*a* has a tapered side wall so that a distance between the gate electrode 41*a* and emitter electrode 45 can be made short. It is therefore possible to raise an electric field intensity at the tip of the emitter electrode and manufacture a field emission element having a low threshold voltage. Also according to the fourth embodiment, the position in height of the emitter electrode 45 is determined by the over-etch depth of the substrate 40 shown in FIG. 7E and the thickness of the first sacrificial film 44 shown in FIG. 7F. A distance between the emitter electrode 45 and gate electrode 41*a* is determined by the thickness of the first sacrificial film 44. The shape of the emitter electrode 45 and the tapered shape of the gate hole of the gate electrode 41*a* are determined by the reflow process shown in FIG. 7D and the etching process shown in FIG. 7E. By properly setting these parameters, the position in height of the emitter electrode, the shapes of the gate and emitter electrodes, a distance between the emitter and gate electrodes and the like can be controlled with good reproductivity.

Reflow of the low melting point film of the fourth embodiment will be described more specifically. Other usable low melting point materials include low melting point glass such as PSG, BPSG, BSG, AsSG, AsPSG, and PGSG, frit glass, covar, solder, Si—Ge, or low melting point metal. These materials can be reflowed by baking in a furnace in a temperature range from 750° C. to 940° C. The reflow temperature depends on an impurity concentration.

It is required that the gate electrode film laminated with a low melting point film and upper and lower layers formed on the gate electrode film have a melting point higher than the reflow temperature. A melting point of polysilicon and amorphous silicon is 1412° C., and the melting points of refractory metals of W and Mo are 3377° C. and 2622° C., respectively. The melting points of refractory silicide films such as $WSi_2$, $MoSi_2$, $TiSi_2$ and $TaSi_2$ are 1887° C., 1980° C., 1538° C., and 2200° C., respectively. The melting points of wiring metal materials of Cu, Ag, Au, Rh, Ir, Co and Ni are 1080° C., 960° C., 1063° C., 1966° C., 2450° C., 1495° C. and 1453° C., respectively. These materials have a melting point higher than the reflow temperatures of low melting point film materials such as PSG, BPSG, BSG, AsSG, AsPSG, PGSG, and Si-Ge, and can be used as the materials of films used in the embodiment.

Al or Al alloy used as the gate electrode film material has a melting point of 660° C. which is lower than the reflow temperatures of PSG, BPSG, BSG, AsSG, AsPSG, PGSG, and Si—Ge, and the like. In this case, flowable SOG can be used. For example, FOx (flowable oxide) manufactured by Dow Corning can be used for taper etching low melting point metal such as Al since Fox softens at 200° C. or higher. The low melting point material of this embodiment can therefore be used for a reflow process at a lower temperature.

FIGS. 8A to 8F are cross sectional views of a substrate illustrating the manufacture processes for a field emission element according to the fifth embodiment of the invention. In the embodiment, the manufacture processes for a two-electrode element having an emitter (field emission cathode) and a gate will be described. Also in this embodiment, a tapered shape is formed by reflowing a low melting point film.

Figure 8A:
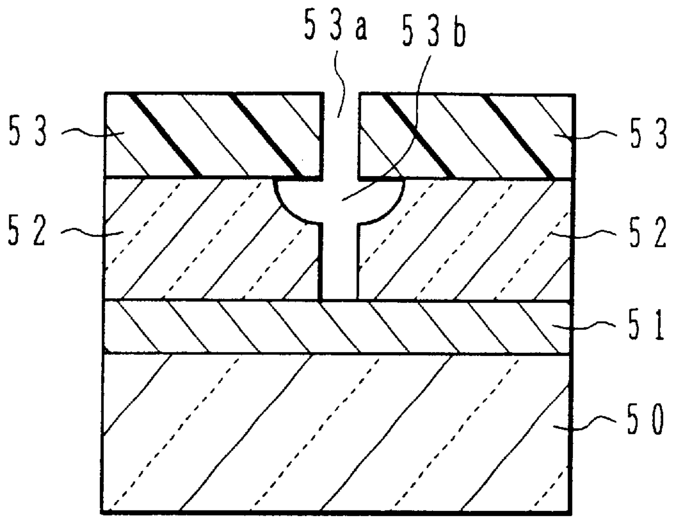
FIGS. 8A to 8F are cross sectional views of a substrate illustrating the manufacture processes for a field emission element according to a fifth embodiment of the invention.

Referring to FIG. 8A, a gate electrode film 51 made of first conductive material is formed on a single layer substrate 50 made of, for example, quartz or the like or on a substrate 50 made of a lamination of an Si layer and a silicon oxide film formed thereon. The first conductive material of the gate electrode film 51 is silicon doped with P (phosphorous) or B (boron) and deposited to a thickness of about 0.3 $\mu$m by low pressure CVD.

For example, the gate electrode film 51 made of silicon is formed under the conditions of a source gas of $SiH_4$ diluted with He, a substrate temperature of 625° C. and a reaction chamber pressure of 30 Pa. In order to lower the resistance value of the gate electrode film 51, P or B ions are diffused or implanted into the gate electrode film 51.

A low melting point film (low temperature reflow film) 52 is formed on the gate electrode film 51. For example, the low melting point film 52 is made of PSG deposited to a thickness of about 0.5 $\mu$m. Instead of PSG, other materials such as BPSG, BSG, AsSG, AsPSG, PGSG and Si—Ge may be used.

Next, photoresist material is coated on the low melting point film 52 and etched through photolithography to form a resist pattern 53 having an opening 53*a*. The low melting point film 52 is isotropically etched via the opening 53*a* to some extent. In this case, an opening 53*b* in the low melting point film 52 expands in a lateral direction by side etching. Next, the low melting point film 52 is anisotropically etched in a vertical direction to expose the partial surface of the gate electrode film 51.

Figure 8B:
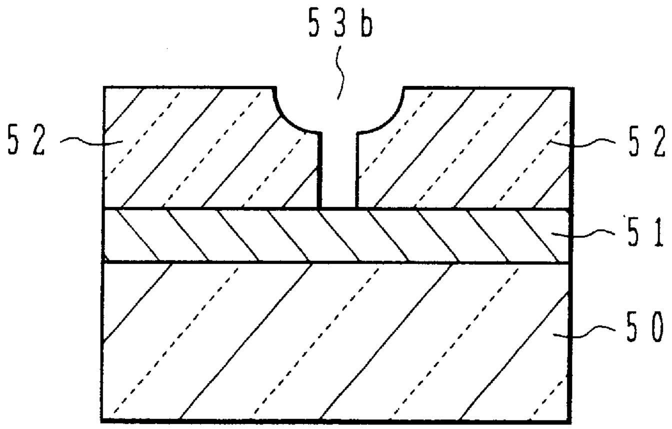
Figure 8C:
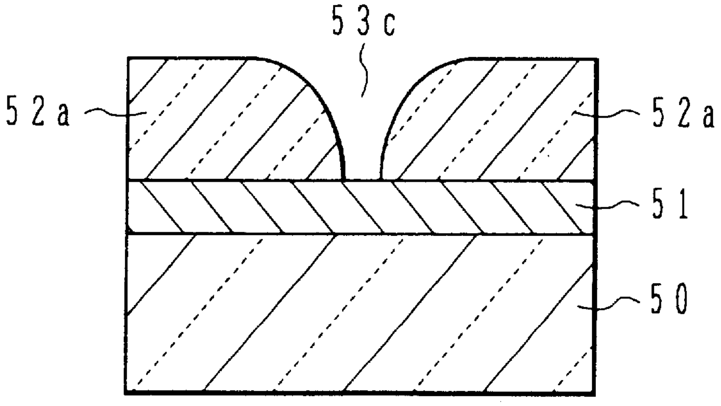

Next, as shown in FIG. 8B, the resist mask 53 is removed. By using a process similar to that shown in FIG. 7D of the fourth embodiment, the low melting point film 52 is heated and reflowed to form a gentle tapered shape as shown in FIG. 8C. Since the low melting point film 52 shown in FIG. 8B has the opening 53*b*, a low melting point film 52*a* having a tapered opening 53*c* can be formed easily.

Figure 8D:
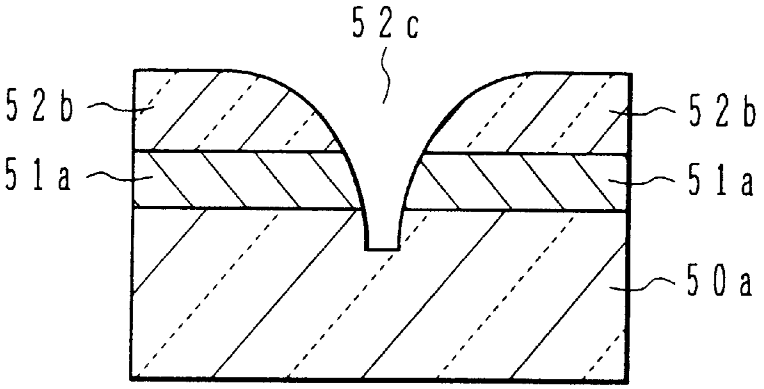

Next, by using the reflowed low melting point film pattern 52*a* as a mask, the gate electrode film 51 made of the first conductive material and the low melting point film 52*a* (changed to a film 52*b*) are etched to form a recess (gate hole) 52*c* having a gentle tapered side wall, as shown in FIG. 8D. This etching is preferably an over-etch to etch the substrate 50 by about 0.1 $\mu$m in depth from the surface of the substrate 50. The depth of this over-etch influences the length and height of an emitter electrode to be later formed. The diameter of the recess 52*c* of the gate electrode film 51*a* is about 0.5 $\mu$m at the bottom and about 0.7 $\mu$m at the upper level, and the depth is about 0.3 $\mu$m.

For example, this etching is performed by using a magnetron RIE system under the conditions of an etching gas of $CO_2$+$CHF_3$+Ar and a reaction chamber pressure of 125 mTorr. Etching rates of the gate electrode film 51 and the low melting point film pattern 52*a* are 1.2 $\mu$m/min and 0.9 $\mu$m/min, respectively.

Figure 8E:
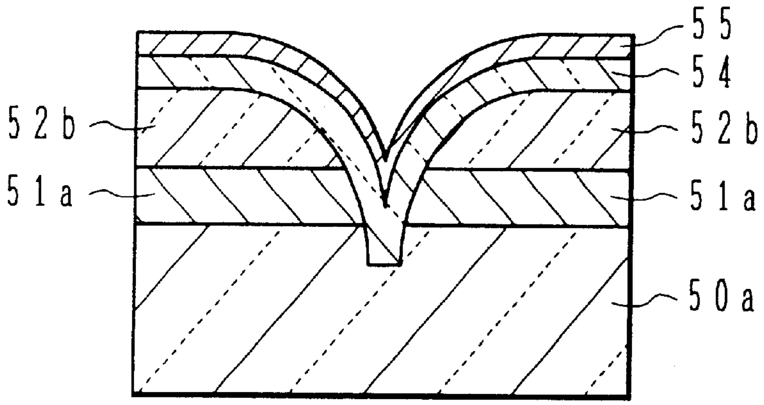

Next, as shown in FIG. 8E, a first sacrificial film (insulating film) 54 of silicon oxide is isotropically deposited on the whole substrate surface to a thickness of 0.3 $\mu$m by atmospheric pressure CVD. For example, the first sacrificial film 54 is formed under the conditions of a source gas of $O_3$ and TEOS and a substrate temperature of 400° C. Under these conditions, the first sacrificial film 54 is deposited inheriting (conformal to) the side wall surface shape of the recess 52*c*.

Next, a first emitter electrode film 55 of second conductive material such as $TiN_x$ is isotropically deposited on the first sacrificial film 54 to a thickness of 0.05 $\mu$m by reactive sputtering. This reactive sputtering is performed by using a DC sputtering system and Ti as a target while a gas of $N_2$+Ar is introduced. The first emitter electrode film 55 is therefore formed inheriting (conformal to) the surface shape of the first sacrificial film 54.

Next, by using processes similar to those of the fourth embodiment shown in FIGS. 7H to 7K, a second emitter electrode film 56 made of third conductive material is deposited and etched back to leave a blanket film 56*a*, and a resistor layer 57 of silicon is deposited to a thickness of about 0.2 $\mu$m on the first emitter electrode 55 and blanket film 56*a* by sputtering. An emitter wiring layer 58 made of fourth conductive material such as Al is deposited on the resistor layer 57 to a thickness of about 0.5 $\mu$m by sputtering.

Figure 8F:
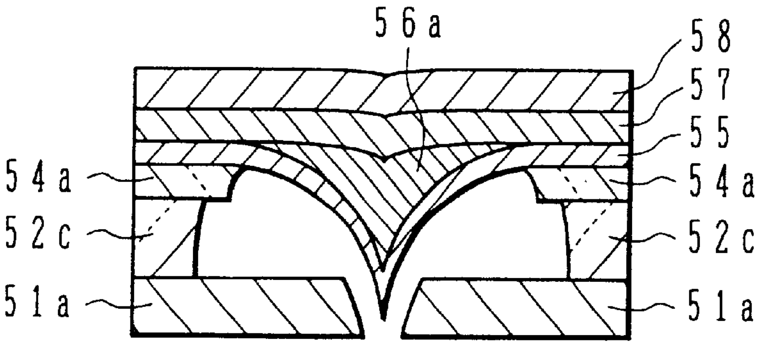

Lastly, by using a process similar to that of the fourth embodiment shown in FIG. 7L, the substrate 50*a* and portions of the first sacrificial film 54 and low melting point film 52*b* are etched and removed from the bottom side to expose the gate electrode 51*a* and first emitter electrode 55 to complete a two-electrode element, as shown in FIG. 8F.

Figure 9A:
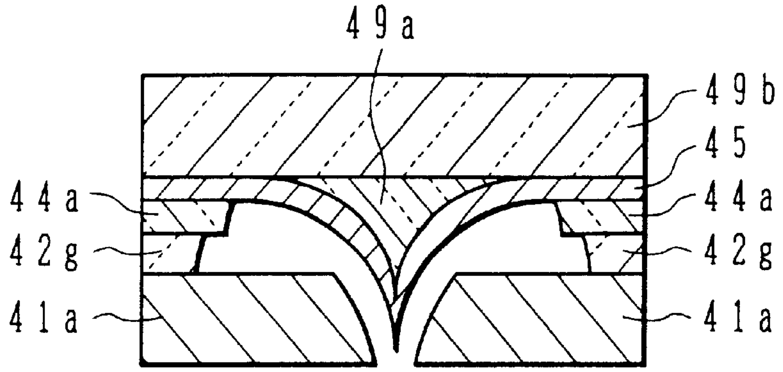
FIGS. 9A to 9C are cross sectional views of the substrates of field emission elements according to a modification of the fourth embodiment.
Figure 9B:
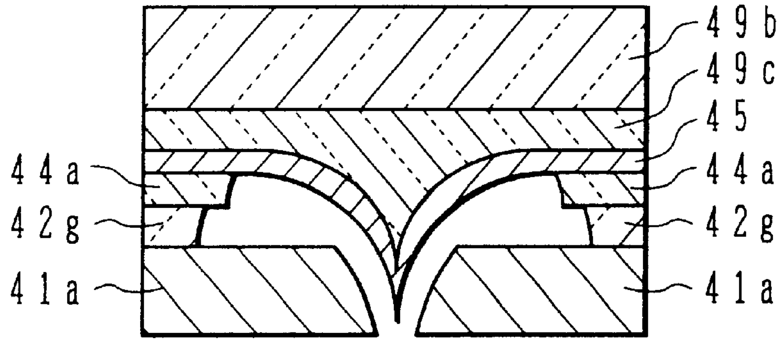
Figure 9C:
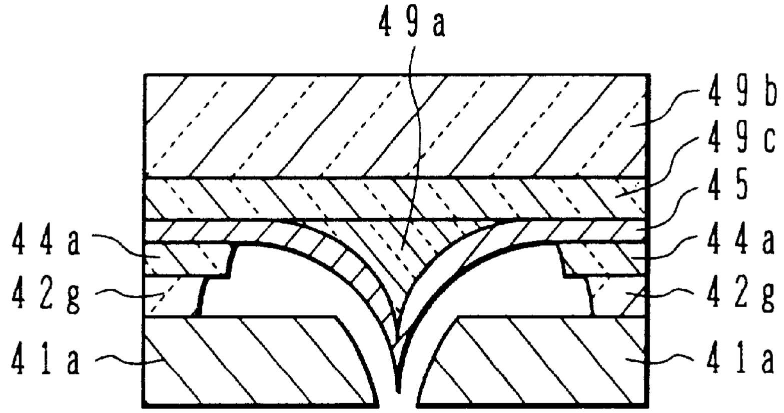

FIGS. 9A to 9C illustrate methods of reinforcing the emitter electrode with a support substrate according to a modification of the fourth embodiment.

With the method shown in FIG. 9A, a recess on the surface of the emitter electrode 45 of the element subjected to the processes shown in FIGS. 7A to 7G of the fourth embodiment is filled with a planarizing layer 49*a* made of, for example, spin-on-glass (SOG). Thereafter, the surface of the planarizing film 49*a* is planarized by chemical mechanical polishing (CMP). Then, a support substrate 49*b* is adhered to the planarizing film 49*a* by electrostatic adhesion or by using adhesive.

Thereafter, by using a process similar to that shown in FIG. 7L, the unnecessary portions such as substrate 40*a* are etched and removed to expose the gate electrode 41*a* and emitter electrode 45 as shown in FIG. 9A and complete a two-electrode element.

Also with the method shown in FIG. 9B, the emitter electrode 45 of the element subjected to the processes shown in FIGS. 7A to 7G of the fourth embodiment is adhered to a support substrate 49*b* by using adhesive 49*c* such as low melting point glass. Thereafter, the unnecessary portions such as substrate 40*a* are etched and removed by a process similar to the etching process shown in FIG. 7L, to expose the gate electrode 41*a* and emitter electrode 45 as shown in FIG. 9B and complete a two-electrode element.

With the method shown in FIG. 9C, a recess on the surface of the emitter electrode 45*a* of the element subjected to the processes shown in FIGS. 7A to 7G of the fourth embodiment is filled with a planarizing layer 49*a* made of, for example, SOG. Thereafter, the surface of the planarizing film 49*a* is planarized by CMP. Then, a support substrate 49*b* is adhered to the planarizing film 49*a* and emitter electrode 45*a* by using adhesive 49*c* such as low melting point glass.

Thereafter, the unnecessary portions such as substrate 40*a* are etched and removed by a process similar to the etching process shown in FIG. 7L, to expose the gate electrode 41*a* and emitter electrode 45 as shown in FIG. 9C and complete a two-electrode element.

Figure 10:
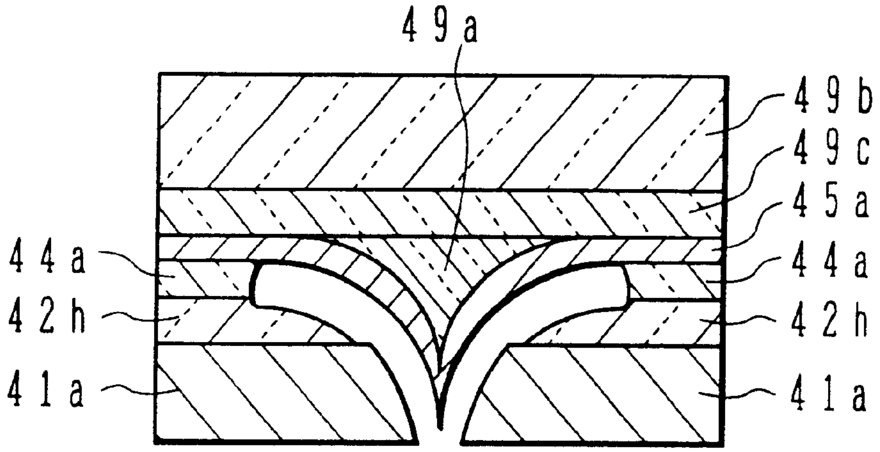
FIG. 10 is a cross sectional view of the substrates of a field emission element according to a modification of the fourth embodiment.

FIG. 10 illustrates a method of reinforcing the emitter electrode with a support substrate according to another modification of the fourth embodiment. This method is the same as the method shown in FIG. 9C excepting that BPSG is used as the material of a low melting point film 42*h*. An etching rate of BPSG is about one fourth of that of $SiO_2$ made of a gas of $O_3$ and TEOS. Since the etching rate of the low melting point film 42*h* made o BPSG is slow, it is possible to prevent the low melting point film 42*h* from being etched completely, and a short circuit of the gate electrode 41*a* and emitter electrode 45 from being formed.

FIGS. 11A to 11H are cross sectional views of a substrate illustrating the manufacture processes for a field emission element (three-electrode element) according to the sixth embodiment of the invention. Also in the embodiment, a tapered shape is formed by reflowing a low melting point film.

Figure 11A:
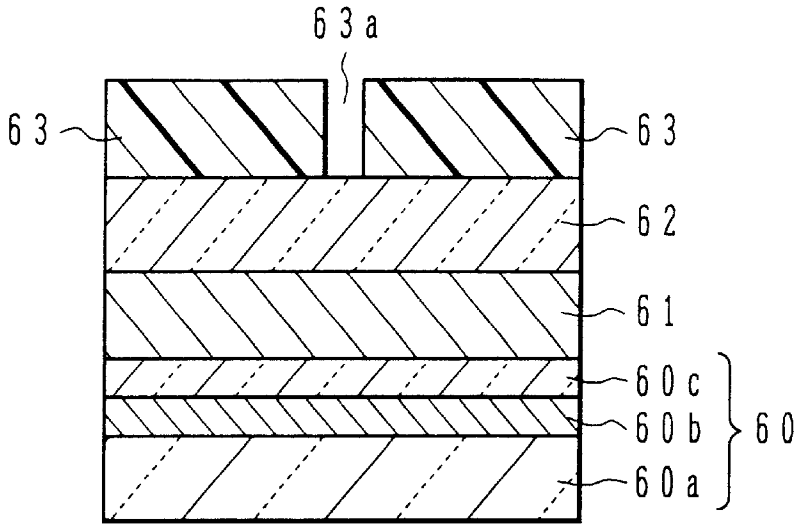
FIGS. 11A to 11H are cross sectional views of a substrate illustrating the manufacturing processes for a field emission element according to a sixth embodiment of the invention.

Referring to FIG. 11A, a substrate 60 is formed by depositing an anode electrode fmm 60*b* made of first conductive material to a thickness of 0.1 $\mu$m by low pressure CVD, on either a single layer substrate 60*a* made of, for example, glass, quartz or the like or on a substrate 60*a* made of a lamination of an Si layer and a silicon oxide film formed thereon, and by forming a first sacrificial film (insulating film) 60*c* made of silicon oxide on the anode electrode film 60*b* to a thickness of 0.1 $\mu$m by atmospheric pressure CVD.

In this case, the first conductive material of the anode electrode 60*b* is silicon doped with P or B in order to lower the resistance value. The anode electrode 60*b* is formed under the conditions of a source gas of $SiH_4$ diluted with He, a substrate temperature of 625° C. and a reaction chamber pressure of 30 Pa. The first sacrificial film 60*c* is formed under the conditions of a source gas of $O_3$ and TEOS and a substrate temperature of 400° C.

On the first sacrificial film 60*c* of the substrate 60 formed as above, a gate electrode film 61 made of second conductive material is formed. The second conductive material of the gate electrode film 61 is made of silicon doped with P (phosphorous) or B (boron) and deposited to a thickness of about 0.3 $\mu$m by low pressure CVD. For example, this gate electrode film 61 made of silicon is formed by low pressure CVD under the conditions of a source gas of $SiH_4$ diluted with He, a substrate temperature of $_{625}$° C. and a reaction chamber pressure of 30 Pa. In order to lower the resistance value of the gate electrode film 61, P or B ions are diffused or implanted into the gate electrode film 61.

A low melting point film (low temperature reflow film) 62 is formed on the gate electrode film 61. For example, the low melting point film 62 is made of PSG deposited to a thickness of about 0.5 $\mu$m. Instead of PSG, other materials such as BPSG, BSG, AsSG, AsPSG, PGSG and Si—Ge may be used.

Next, by using a process similar to that of the fourth embodiment shown in FIG. 7B, photoresist material is coated on the low melting point film 62 and etched through photolithography to form a resist pattern 63 having an opening 63*a* about 0.41 $\mu$m in diameter at its surface level.

Figure 11B:
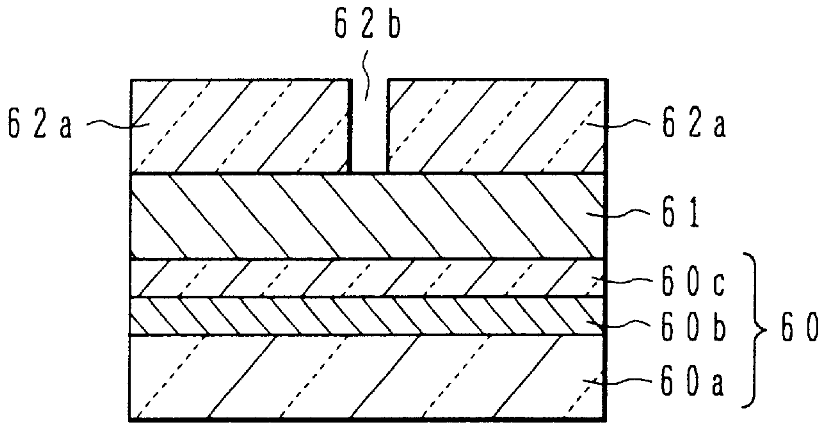
Figure 11C:
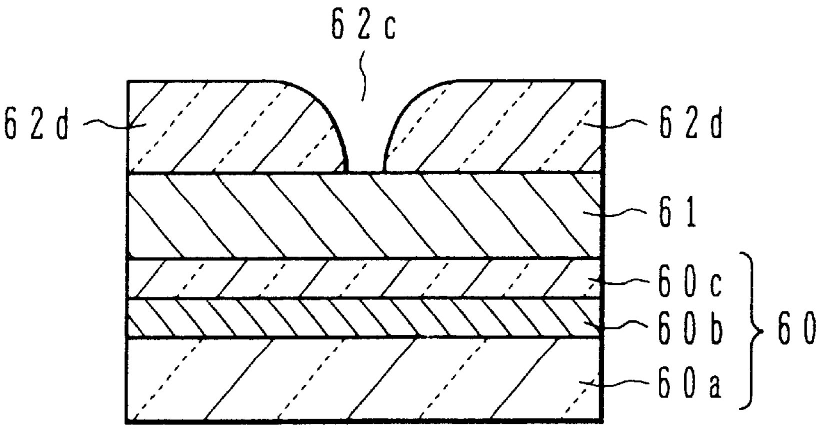

By using the resist pattern 63 as a mask, the low melting point film 62 is isotropically etched to form an opening 62*b* having a vertical or generally vertical side wall reaching the gate electrode film 61, as shown in FIG. 11B. For example, this etching is performed by using a magnetron RIE under the conditions of an etching gas of $CHF_3$+$CO_2$+Ar and a reaction chamber pressure of 50 mTorr. In order to prevent the resist from being softened during the etching, it is preferably to cool the bottom surface of the substrate 60 with He.

Next, by using a process similar to that of the fourth embodiment shown in FIG. 7D, the low melting point film 62*b* is heated and reflowed to form a low melting point film pattern 62*d* having a tapered recess 62*c* with a gentle slope upper corner or shoulder.

Figure 11D:
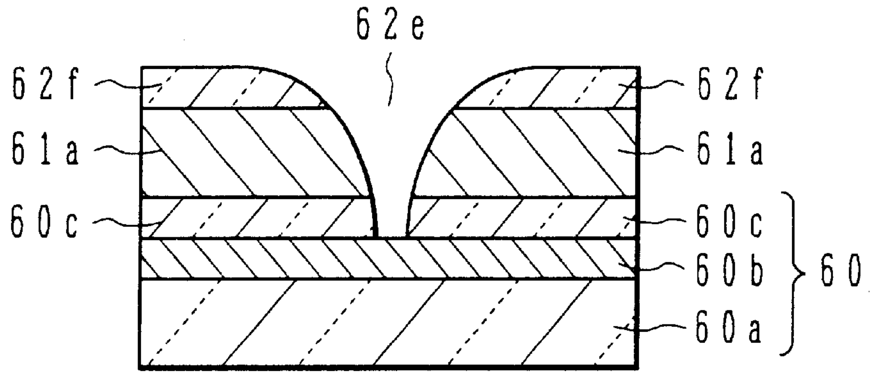

Next, by using a process similar to that of the fourth embodiment shown in FIG. 7E, the gate electrode film 61 made of the first conductive material and the low melting point pattern 62*d* are etched to form a recess (gate hole) 62*e* having a gentle tapered side wall such as shown in FIG. 11D, by using the reflowed low melting point film pattern 62*d* as a mask. This etching is an over-etch to etch a portion of the first sacrificial film 60*c* and expose the anode electrode 60*b* of the substrate 60 and to form a reduced thickness low melting point film pattern 62*f*. Etching rates of the gate electrode film 61 and the low melting point pattern 62*d* are about 1.2 $\mu$m/min and 0.9 $\mu$m/min, respectively.

Figure 11E:
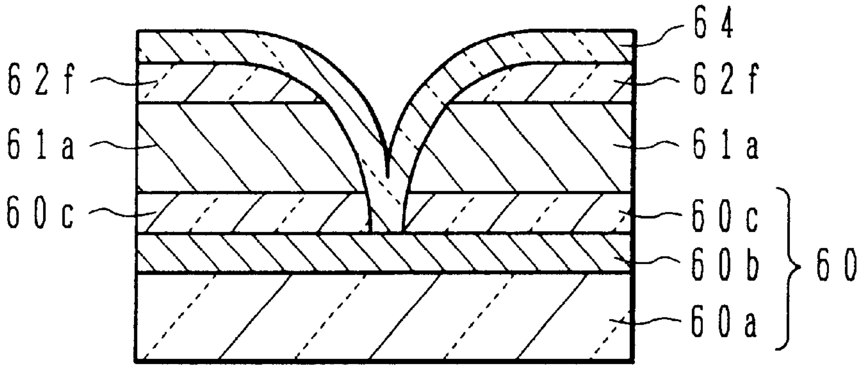
Figure 11F:
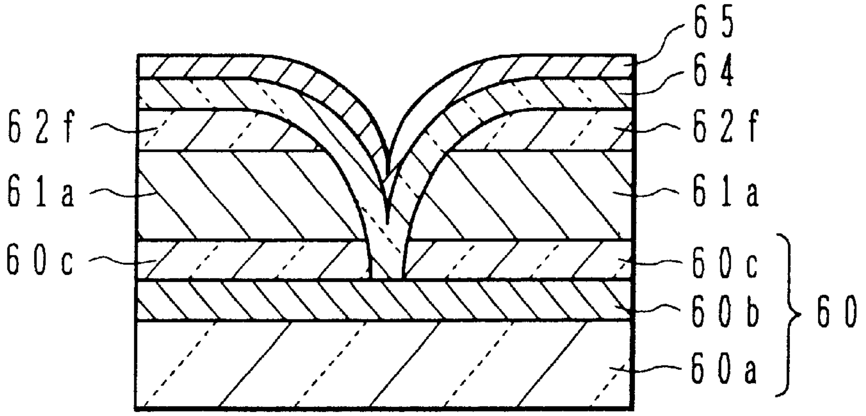

Next, by using a process similar to that of the fourth embodiment shown in FIG. 7F, a second sacrificial film (insulating film) 64 of silicon oxide is isotropically deposited on the whole substrate surface to a thickness of 0.3 $\mu$m by atmospheric pressure CVD as shown in FIG. 11E.

Next, by using a process similar to that of the fourth embodiment shown in FIG. 7F, an emitter electrode film 65 of third conductive material such as $TiN_x$ is isotropically deposited on the second sacrificial film 64 to a thickness of 0.05 $\mu$m by reactive sputtering.

Next, a resist mask (not shown) having a predetermined opening is formed on the whole surface of the emitter electrode film 65 by using ordinary photolithography. A portion of the emitter electrode film 65 not used as the cathode is etched and removed through the opening to form a slit opening 66 shown in FIG. 11G. For example, this etching is performed by using a magnetron RIE system under the conditions of a gas of $Cl_2$ and a reaction chamber pressure of 125 mTorr.

Next, via the slit opening 66, portions of the second and first sacrificial films 64 and 60*c* are etched to expose the gate electrode 61*a*, emitter electrode 65*a* and anode electrode 60*b* and complete a three-electrode element. For etching the first and second silicon oxide films and PSG of the low melting point film, $HF+NH_4F$ is used.

Figure 12A:
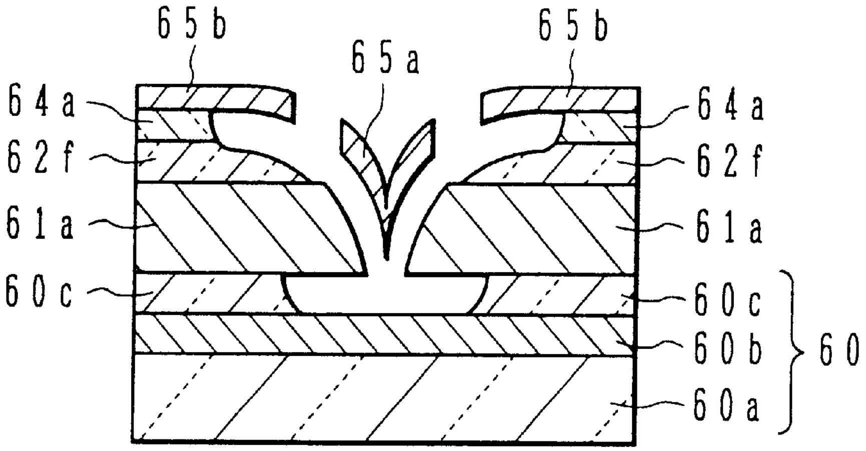
FIGS. 12A and 12B are cross sectional views of the substrates of field emission elements according to a modification of the sixth embodiment.

FIG. 12A shows a modification of a three-electrode element of the sixth embodiment. BPSG is used as the material of a low melting point film 62*f*, instead of PSG. Therefore, during the last process shown in FIG. 11H for etching and removing the unnecessary portions, the low melting point film 62*f* is hardly removed.

Figure 12B:
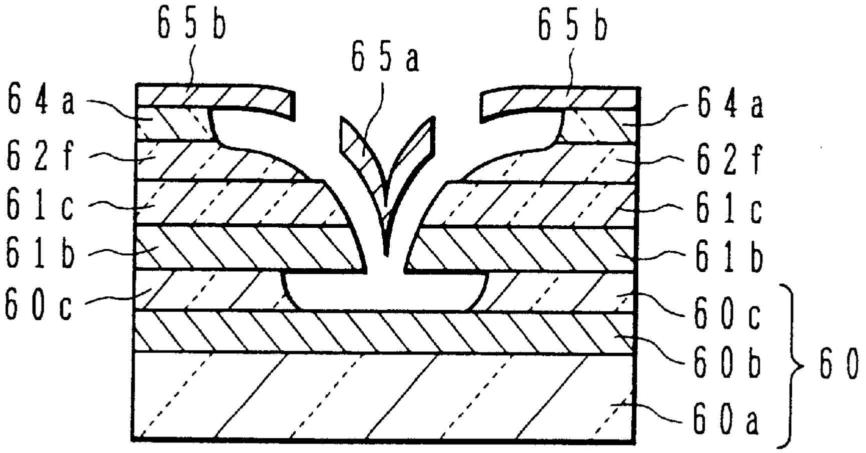

FIG. 12B shows another modification of a three-electrode element of the sixth embodiment. The different structure from the three-electrode element shown in FIG. 12A is that a layer corresponding to the gate electrode layer 61*a* has a lamination structure of a gate electrode film 61*b* and an antireflection film 61*c* such as $SiN_x$ and $SiO_xN_y$ and that the etching rates of first and second sacrificial films 60*c* and 64*a* are made generally equal.

Figure 11G:
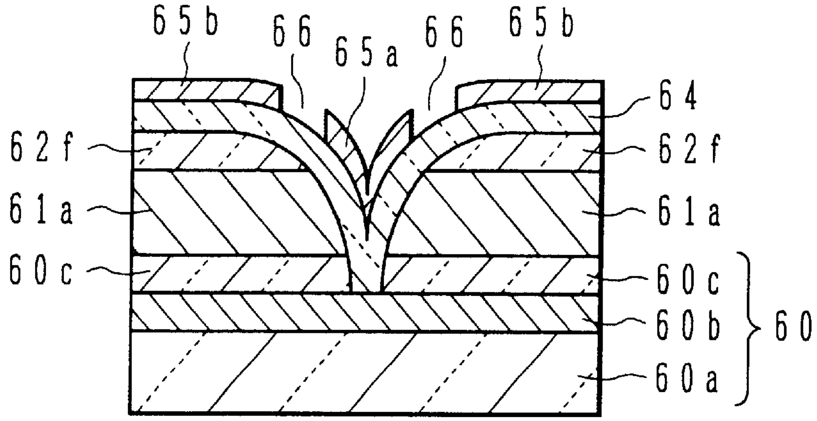
Figure 11H:
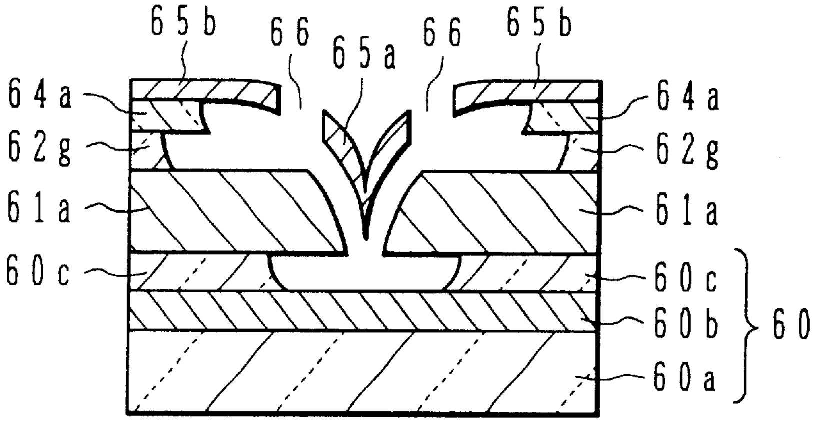

Similar to a process shown in FIG. 11G, a resist mask having a predetermined opening is formed on an emitter electrode film 65, and a portion of the emitter electrode 65 not used as the cathode is etched and removed via the opening to form a slit opening 66 such as shown in FIG. 11G. Then, similar to the process shown in FIG. 11H, portions of the second sacrificial film 64*a*, low melting point film 62*f* and first sacrificial film 60*c* are etched and removed via the slit opening 66. In this case, since the etching rates of the first and second sacrificial films 60*c* and 64*a* are approximately equal, the unnecessary portions are removed as shown in FIG. 12B to expose the gate electrode 61*b*, emitter electrode 65*a* and anode electrode 60*b* and complete a three-electrode element.

Figure 14:
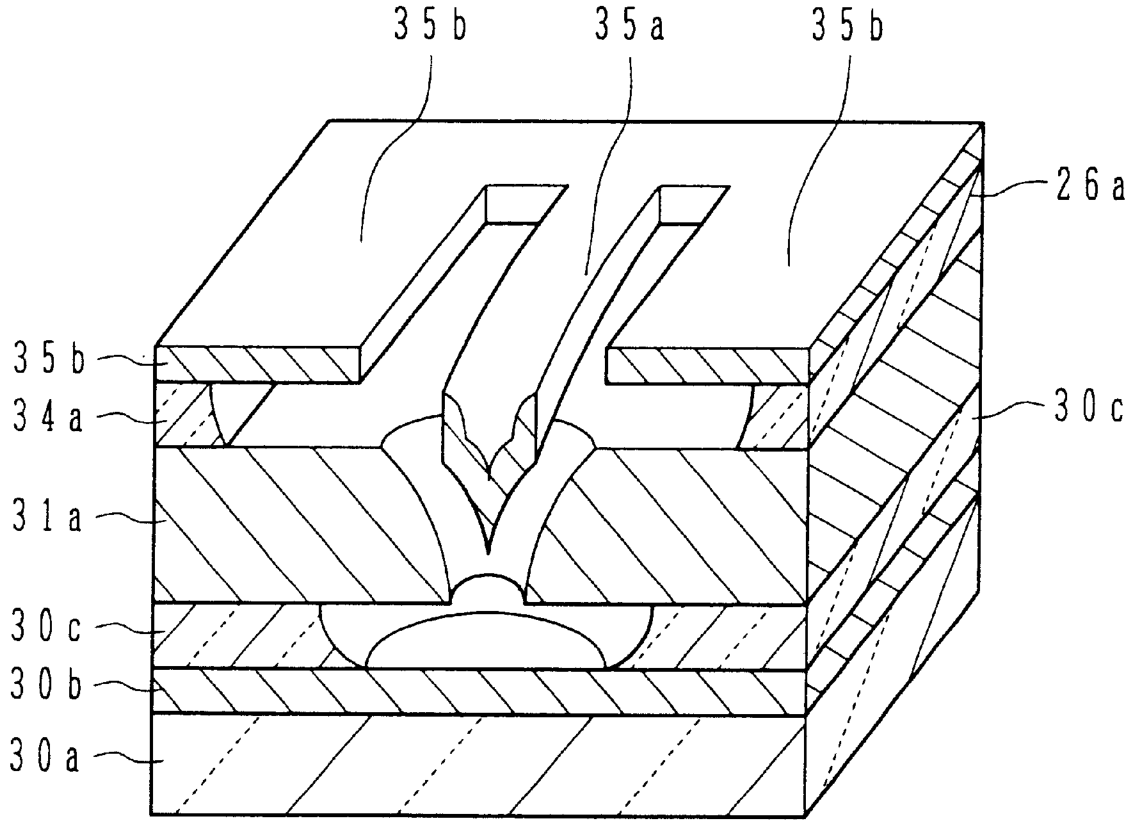
FIG. 14 is a perspective view of a field emission element according to an embodiment of the invention.

FIG. 14 is a perspective view of a three-electrode element of the third embodiment shown in FIG. 5H. The tip of the emitter electrode 35*a* is disposed within the gate hole of the gate electrode 31*a* and has a shape edge like a needle. The three-electrode element has the emitter electrode 35*a* as a cathode and the anode electrode 30*b* as a plate. As a predetermined positive potential is applied to the gate electrode 31*a*, an electron beam is emitted from the emitter electrode 35*a* toward the anode electrode 30*b* while being converged.

Figure 15:
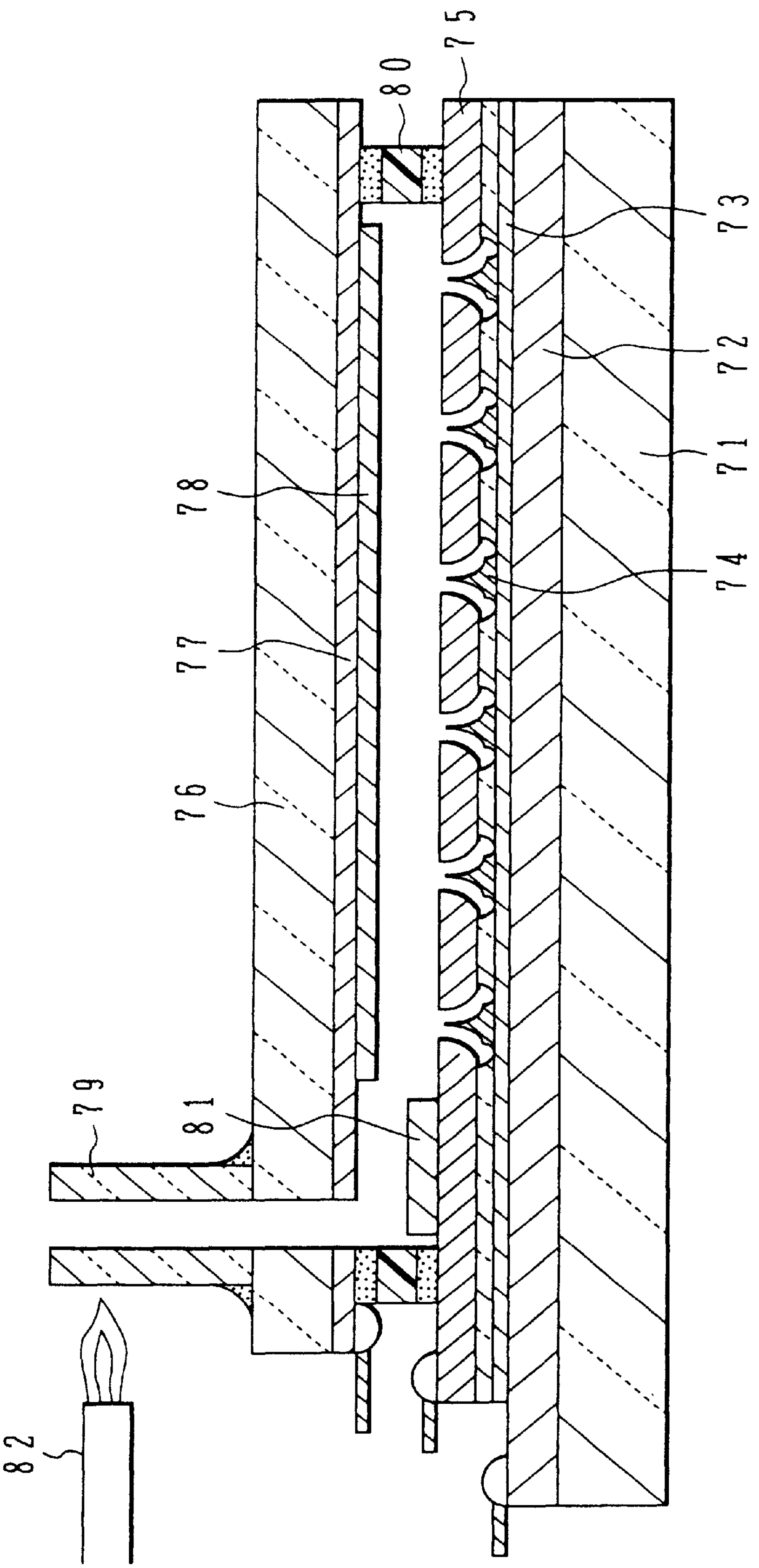
FIG. 15 is a cross sectional view of a flat panel display using field emission elements.
Figure 16:
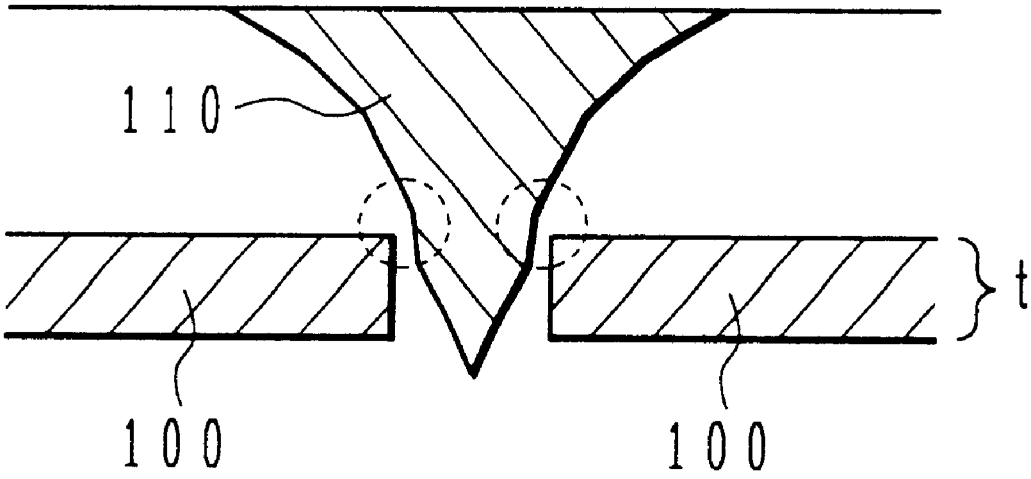
FIG. 16 is a cross sectional view of a field emission element.

FIG. 15 is a cross sectional view of a flat panel display using field emission elements of the embodiment described above. Each field emission element used is a two-electrode element formed by the manufacture method of, for example, the first embodiment.

Formed on a support substrate 71 made of insulating material, are a wiring layer 72 made of A1, Cu or the like and a resistor layer 73 made of polysilicon or the like. The wiring layer 72 and resistor layer 73 have predetermined patterns. On the resistor layer 73, a number of gate electrodes 75 having a gate hole (opening) and a number of emitter electrodes 74 whose tips are disposed within the gate holes are disposed to form a field emitter array (FEA). A voltage can be applied independently to each gate electrode 75, although the detailed structure is not shown in FIG. 15. A voltage can also be applied independently to each emitter electrode 74.

Facing an electron source including the emitter electrode 74 and gate electrode 75, an opposing substrate is disposed including a transparent substrate 76 made of glass, quartz, or the like. The opposing substrate has a transparent electrode (anode electrode) 77 made of ITO or the like disposed under the transparent electrode 76 and a fluorescent member 78 disposed under the transparent electrode 77.

The electron source and opposing substrate are joined together via a spacer 80 made of a glass substrate and coated with adhesive, with the distance between the transparent electrode 77 and emitter electrode 74 being maintained about 0.1 to 5 mm. The adhesive may be low melting point glass.

Instead of the spacer 80 of a glass substrate, a spacer 80 made of adhesive such as epoxy resin with glass beads being dispersed therein may be used.

A getter member 81 is made of Ti, Al, Mg, or the like and prevents emitted gas from attaching again to the surface of the emitter electrode 74.

An air exhaust pipe 79 is coupled to the opposing substrate. By using this air exhaust pipe 79, the inside of the flat display panel is evacuated to about $10^{-5}$ to $10^{-9}$ Torr, and then the air exhaust pipe 79 is sealed by using a burner 82 or the like. Thereafter, the anode electrode (transparent electrode) 77, emitter electrode 74, and gate electrode 75 are wired to complete the flat panel display.

The anode electrode (transparent electrode) 77 is always maintained at a positive potential. A display pixel is two-dimensionally selected by an emitter wiring and a gate wiring. Namely, a field emission element at a cross point between the emitter and gate wirings applied with voltages is selected.

The emitter electrode is applied with a negative potential (or ground potential) and the gate electrode is applied with a positive potential, so that electrons are emitted from the emitter electrode toward the anode electrode. When electrons are collided with the fluorescent member 78, light is emitted from the collided area (pixel).

As another embodiment of the invention, the first sacrificial film of the first to sixth embodiments is made of an insulating film such as a silicon oxide film $SiO_x$, a silicon nitride film $SiN_x$ and a silicon oxynitride film $SiO_xN_y$. The first sacrificial film may be made of getter material such as Ti, Ta and zirconium.

The gate electrode and emitter electrode may be made of semiconductor such as polysilicon and amorphous silicon, silicide compound such as $WSi_x$ $TiSi_x$ and $MoSi_x$, or metal such as Al, Cu, W, Mo, Ni, Cr, Hf, and $TiN_x$.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a field emission element, comprising the steps of:

(a) forming a surface layer including a gate film made of a conductive material on a substrate;

(b) forming a resist pattern on the surface layer by photolithography, the resist pattern having an opening with a predetermined shape;

(c) reflowing the resist pattern to make the opening have an inner diameter gradually reducing toward the substrate;

(d) anisotropically etching the gate film by using the reflowed resist pattern as a mask to form an opening through the gate film, the opening having an inner diameter reducing gradually toward the substrate;

(e) forming a first sacrificial film covering the gate film having the opening;

(f) forming an emitter film made of a conductive material on the first sacrificial film; and (g) removing a portion or a whole of the substrate and a portion of the first sacrificial film to expose the emitter film and the gate film.

2. A method according to claim 1, wherein the surface layer includes only the gate film.

3. A method according to claim 1, wherein:

said step (c) forms the resist pattern having the opening, the opening having the inner diameter gradually reducing toward the substrate, and a cross section of the opening having a gently tapered shape; and said step (d) forms the gate film having the opening, a cross section of the opening having a gently tapered shape.

4. A method according to claim 1, wherein said step (d) anisotropically etches the gate film and the substrate by using the reflowed resist pattern as a mask to form the opening which passes through the gate film and forms a recess in a surface layer of the substrate.

5. A method according to claim 1, further comprising a step of removing the resist pattern after said step (d) and before said step (e).

6. A method according to claim 1, wherein said step (c) reflows the resist pattern by heat treatment.

7. A method according to claim 1, wherein said step (c) performs the heat treatment at a temperature higher than 140° C.

8. A method according to claim 7, wherein said step (c) performs the heat treatment at a temperature higher than 140° C. and lower than 180° C.

9. A method according to claim 6, wherein said step (c) performs the heat treatment at a temperature of 150° C. or higher.

10. A method according to claim 9, wherein said step (c) performs the heat treatment at a temperature range from 150° C. to 160° C.

11. A method according to claim 6, wherein a melting point of the gate film is higher than a temperature of the heat treatment at said step (c).

12. A method according to claim 6, wherein melting points of the substrate and the gate film are higher than a temperature of the heat treatment at said step (c).

13. A method according to claim 1, wherein:

the surface layer includes only the gate film;

said step (d) anisotropically etches the gate film and the substrate by using the reflowed resist pattern as a mask to form the opening which passes through the gate film and forms a recess in a surface layer of the substrate; and the method further comprises a step of removing the resist pattern after said step (d) and before said step (e).

14. A method according to claim 1, wherein said step (g) etches and removes a portion or a whole of the substrate and a portion of the first sacrificial film.

15. A method according to claim 1, wherein said step (g) etches and removes a whole of the substrate and a portion of the first sacrificial film.

16. A method according to claim 1, wherein:

the substrate includes an anode film made of a conductive material and an insulating film formed on the anode film; and said step (g) removes a portion of the first sacrificial film and a portion of the insulating film to expose the emitter film, the gate film and the anode film.

17. A method according to claim 1, wherein the first sacrificial film is made of an insulating material.

18. A method according to claim 1, further comprising a step of filling a recess on a surface of the emitter electrode with a blanket film made of a conductive material, after said step (f) and before said step (g).

19. A method according to claim 1, further comprising a step of adhering the emitter electrode to a support substrate, after said step (f) and before said step (g).

20. A method according to claim 1, wherein:

the surface layer has the gate film and a second sacrificial film formed on the gate film;

said step (d) forms an opening through the second sacrificial film and the gate film; and said step (e) forms the first sacrificial film covering the surface layer with the opening.

21. A method according to claim 20, wherein the second sacrificial film is an antireflection film.

22. A method according to claim 21, wherein the antireflection film is made of $SiN_x$, $SiO_xN_y$ or $TiN_x$.

23. A method according to claim 20, wherein the second sacrificial film is made of a getter material.

24. A method according to claim 23, wherein the getter material is Ti, Ta or zirconium.

25. A method according to claim 20, wherein the second sacrificial film is made of an insulating material.

* * * * *